United States Patent
Chikamori et al.

(10) Patent No.: US 11,205,315 B2
(45) Date of Patent: Dec. 21, 2021

(54) MAGNETISM DETECTION DEVICE, COIN RECOGNITION DEVICE, AND METHOD FOR DETECTING MAGNETISM USING MAGNETISM DETECTION DEVICE

(71) Applicant: GLORY LTD., Hyogo (JP)

(72) Inventors: Masafumi Chikamori, Hyogo (JP); Seiji Morikawa, Hyogo (JP); Daiki Yokoie, Hyogo (JP); Ryo Hasegawa, Hyogo (JP); Hidekazu Tanaka, Hyogo (JP)

(73) Assignee: GLORY LTD., Hyogo (JP)

( * ) Notice: Subject to any disclaimer, the term of this patent is extended or adjusted under 35 U.S.C. 154(b) by 137 days.

(21) Appl. No.: 16/498,453

(22) PCT Filed: Mar. 22, 2018

(86) PCT No.: PCT/JP2018/011446
§ 371 (c)(1),
(2) Date: Sep. 27, 2019

(87) PCT Pub. No.: WO2018/180899
PCT Pub. Date: Oct. 4, 2018

(65) Prior Publication Data
US 2020/0111276 A1   Apr. 9, 2020

(30) Foreign Application Priority Data

Mar. 29, 2017 (JP) .............................. JP2017-065489

(51) Int. Cl.
*G01R 33/12* (2006.01)
*G07D 5/08* (2006.01)

(52) U.S. Cl.
CPC ............... *G07D 5/08* (2013.01); *G01R 33/12* (2013.01)

(58) Field of Classification Search
CPC ............ G07D 1/00; G07D 3/14; G07D 3/126; G07D 5/08; G01N 27/06; G01N 11/10;
(Continued)

(56) References Cited

U.S. PATENT DOCUMENTS

| | | | | |
|---|---|---|---|---|
| 5,743,372 A | * | 4/1998 | Furuya | G07D 5/08 194/318 |
| 8,490,771 B2 | * | 7/2013 | Toji | G07D 7/04 194/319 |

(Continued)

FOREIGN PATENT DOCUMENTS

| | | |
|---|---|---|
| EP | 2352131 | 8/2011 |
| GB | 2244364 | 11/1991 |

(Continued)

OTHER PUBLICATIONS

International Search Report issued in International Patent Application No. PCT/JP2018/011446, dated Jun. 26, 2018 (with English translation).

(Continued)

*Primary Examiner* — Son T Le
(74) *Attorney, Agent, or Firm* — Greenblum & Bernstein, P.L.C.

(57) ABSTRACT

A magnetism detection device capable of improving the ability to detect magnetic features of coins and reducing a change in outputs due to a change in transport positions of coins, a coin recognition device, and a method for detecting magnetism using the magnetism detection device. The magnetism detection device includes a transport path on which a coin is to be transported, detection coils arranged on at least one side of a transport surface of the transport path and along a direction crossing a transport direction of the coin, (Continued)

and a controller configured to detect a magnetic feature of the coin based on an output signal from at least one but not all of the detection coils.

15 Claims, 22 Drawing Sheets

(58) Field of Classification Search
CPC .... G01N 33/2876; G01N 11/16; G01N 27/08; G01N 11/00; G01N 27/221; G01N 27/24; G01N 9/36; G01N 33/2835; G01N 33/2888

See application file for complete search history.

(56) References Cited

U.S. PATENT DOCUMENTS

| | | |
|---|---|---|
| 2003/0209402 A1 | 11/2003 | Matubara et al. |
| 2009/0223778 A1 | 9/2009 | Hibari et al. |
| 2011/0184697 A1* | 7/2011 | Tada .................. G07D 5/08 702/173 |
| 2012/0138420 A1 | 6/2012 | Leibu et al. |

FOREIGN PATENT DOCUMENTS

| | | |
|---|---|---|
| GB | 2488376 | 8/2012 |
| JP | 2-151991 | 6/1990 |
| JP | 4-137090 | 5/1992 |
| JP | 8-212416 | 8/1996 |
| JP | 9-35113 | 2/1997 |
| JP | 2002-277440 | 9/2002 |
| JP | 2002-279474 | 9/2002 |
| JP | 2005-18301 | 1/2005 |
| JP | 2007-34586 | 2/2007 |
| JP | 2009-26339 | 2/2009 |
| JP | 2009-211501 | 9/2009 |
| JP | 2010-231705 | 10/2010 |
| JP | 2013-164708 | 8/2013 |
| JP | 2017-58982 | 3/2017 |

OTHER PUBLICATIONS

International Preliminary Report issued in International Patent Application No. PCT/JP2018/011446, dated Oct. 1, 2019 (with English translation).

* cited by examiner

FIG.2
(a)
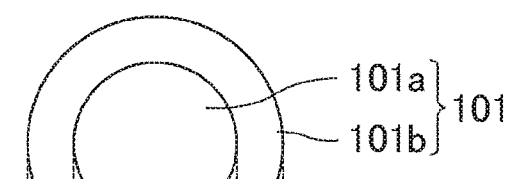
(b)
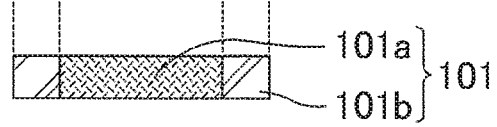

FIG.3
(a)
(b)
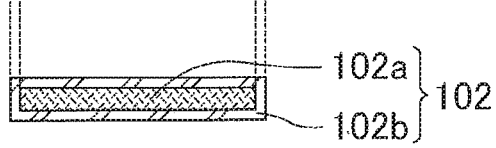
(c)
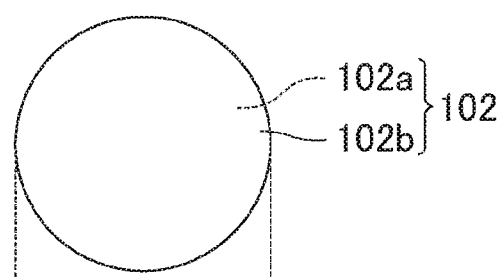
(d)
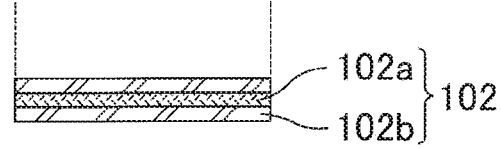

FIG.8
(a)
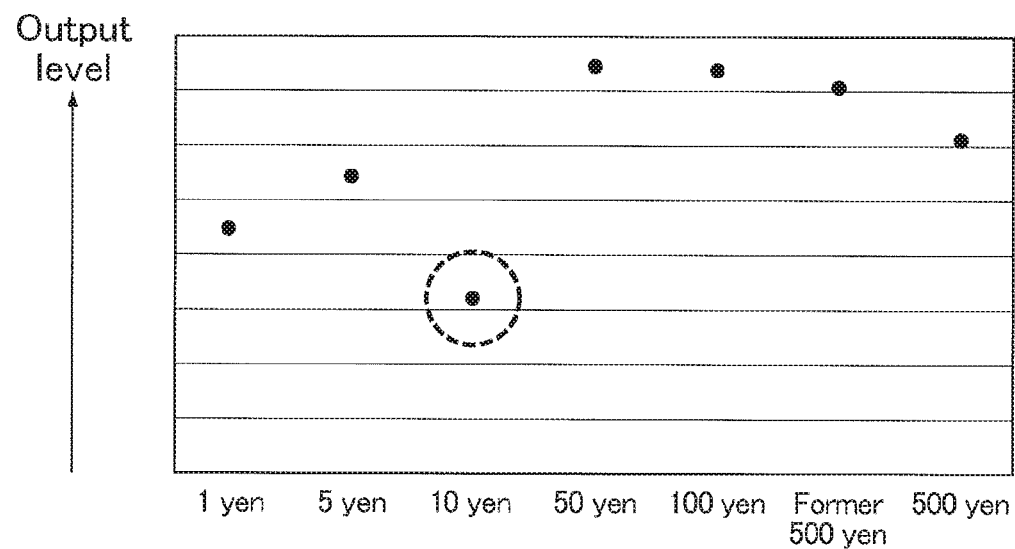
(b)
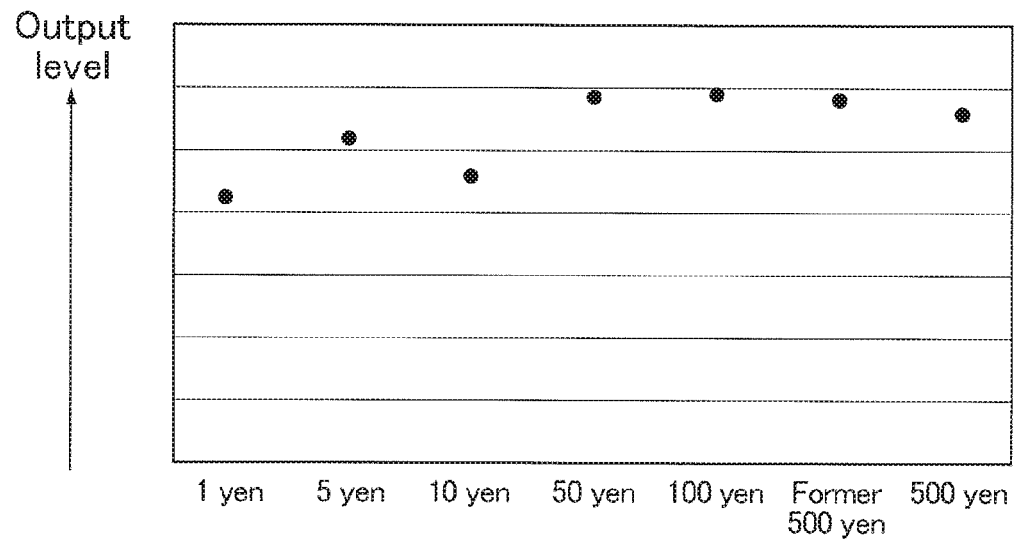

FIG.15
(a)
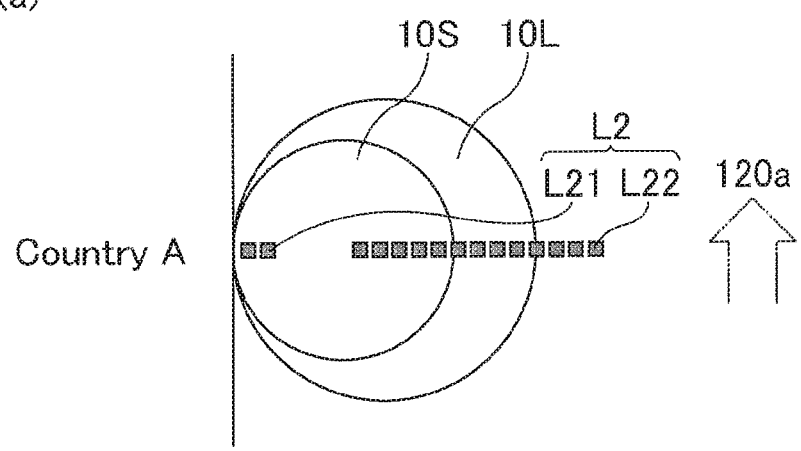
Country A
(b)
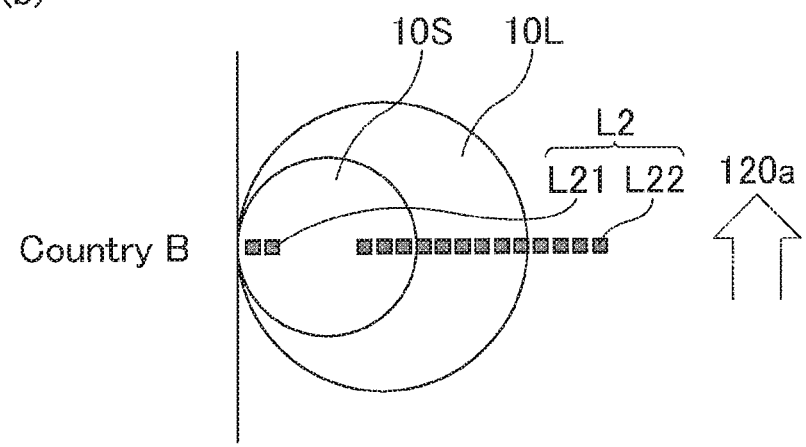
Country B

FIG.19
(a)
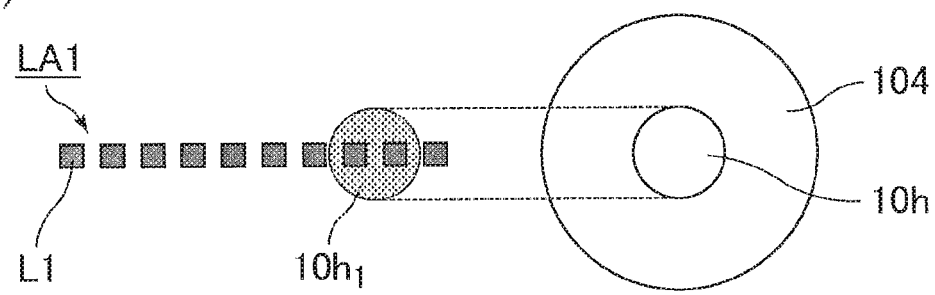
(b)
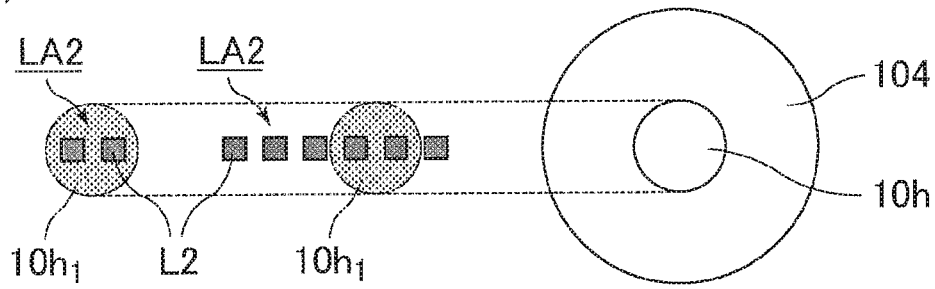

FIG.20
(a)
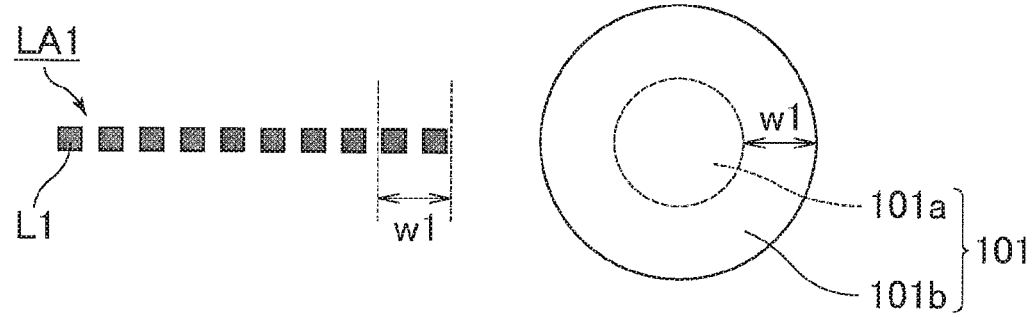
(b)
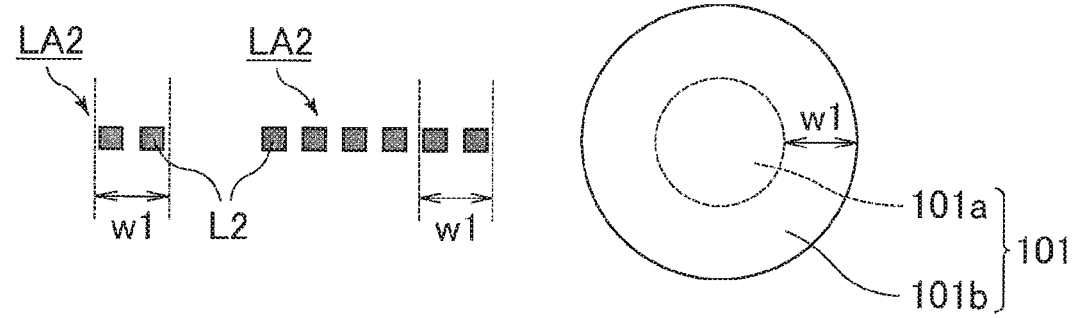

FIG.22
(a)
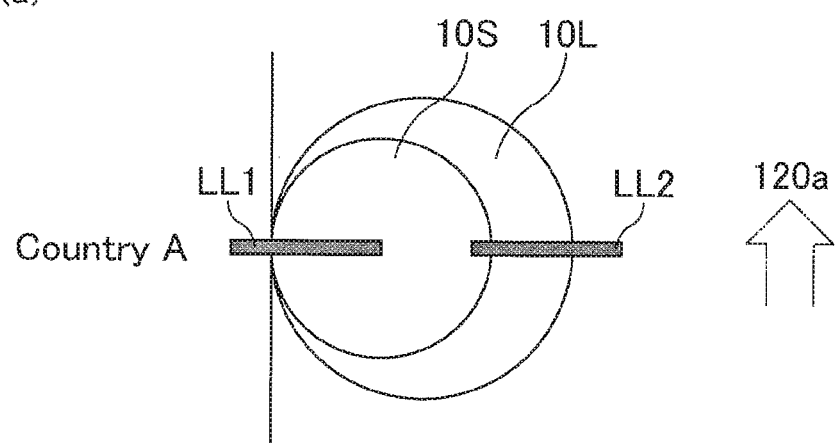
(b)
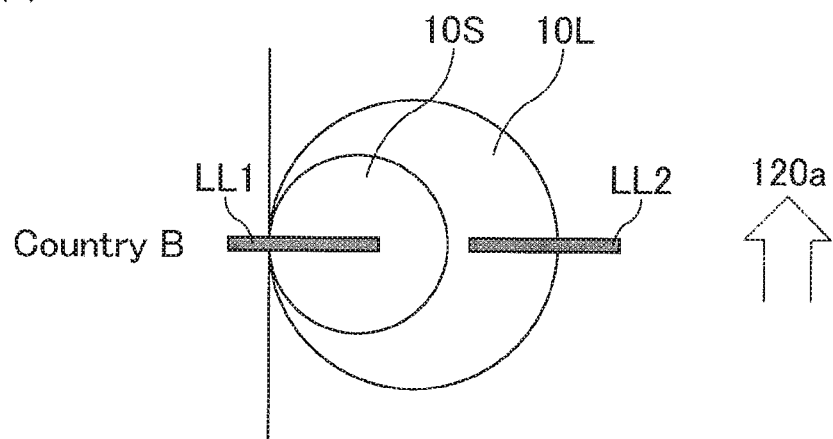

MAGNETISM DETECTION DEVICE, COIN RECOGNITION DEVICE, AND METHOD FOR DETECTING MAGNETISM USING MAGNETISM DETECTION DEVICE

TECHNICAL FIELD

The present invention relates to a magnetism detection device, a coin recognition device, and a method for detecting magnetism using the magnetism detection device. The present invention specifically relates to a magnetism detection device, a coin recognition device, and a method for detecting magnetism using the magnetism detection device suitable for detecting materials of coins.

BACKGROUND ART

Conventional coin handling machines used for handling such as counting of coins include a coin recognition device (coin recognition sensor) that recognizes the denominations of coins. The coin recognition device may be provided with a magnetism detection device (magnetism detection sensor) that detects magnetic features of coins.

Patent Literature 1 discloses a coin recognition sensor in which a conductive ceramic is applied to a bottom and side face of a coin passage of the coin recognition sensor to discharge the static electricity on coins and prevent generation of the static electricity, whereby the coin recognition sensor can surely recognize the coins transported on a sliding surface.

Patent Literature 2 discloses metal piece recognizer including a metal piece detection sensor, wherein the metal piece detection sensor includes a reflective detection sensor, a first transmissive detection sensor disposed to sandwich one end of a passage through which coins are transported, and a second transmissive detection sensor disposed to sandwich the other end of the passage, and the metal piece recognizer can surely recognize metal pieces such as clad coins or bicolor coins made of multiple materials by the use of exciting signals of multiple frequencies.

CITATION LIST

Patent Literature

Patent Literature 1: JP 2002-279474 A
Patent Literature 2: JP 2002-277440 A

SUMMARY OF INVENTION

Technical Problem

Magnetism detection devices to be mounted on devices such as coin recognition devices are desired to have (1) an improved ability to detect magnetic features of coins and (2) a reduced change in outputs due to a change in transport positions of coins caused by, for example, alignment failure.

Conventional magnetism detection devices as disclosed in Patent Literature 1 and Patent Literature 2 have a wide detection area in detection of a magnetic feature with a detection sensor, as illustrated in the cross-sectional views of FIG. 4 of Patent Literature 1 and FIG. 2 of Patent Literature 2. Thus, in detecting a magnetic feature of a coin under transport in a transport direction 120a using a conventional magnetism detection device as illustrated in FIG. 22(a) and focusing on a detection coil LL1 on the left side, the area of a coin 10L having a larger diameter within the detection area of the coil is greater than the area of a coin 10S having a smaller diameter within the detection area of the coil. Accordingly, the area of the coin to be detected within the detection area is influenced by the coin diameter.

The amount of magnetic flux changed by passing of a coin depends not only on the material of the coin within the detection area but also the area thereof. Accordingly, the output of the detection sensor is also influenced by the coin diameter. If alignment failure of coins occurs, the areas of the coins within the detection area change even for the same coins and therefore the outputs of the detection sensor also change.

As illustrated in FIG. 22(b), in the case of a country B different from the country A that is the target in FIG. 22(a), the degree of covering (degree of overlapping) of the detection coil changes from country or coin to country or coin. For example, a detection coil LL2 on the right side fails to cover a coin 10S having a smaller diameter. Accordingly, the structure of the magnetism detection device may need to be modified for some target countries or coins.

In response to the above issues, an object of the present invention is to provide a magnetism detection device capable of improving the ability to detect magnetic features of coins and reducing a change in outputs due to a change in transport positions of coins, a coin recognition device, and a method for detecting magnetism using the magnetism detection device.

Solution to Problem

A first aspect of the present invention is a magnetism detection device comprising: a transport path on which a coin is to be transported; detection coils arranged on at least one side of a transport surface of the transport path and along a direction crossing a transport direction of the coin; and a controller configured to detect a magnetic feature of the coin based on an output signal from at least one but not all of the detection coils.

In the first aspect of the present invention, the magnetism detection device further comprises a substrate on which the detection coils are arranged, the transport path is disposed to penetrate an opening of the substrate, and the at least one but not all of the detection coils is a detection coil corresponding to a position on the coin inside from an edge of the coin by a predetermined distance when the center of the coin passes through the opening.

In the first aspect of the present invention, the magnetism detection device further comprises a substrate on which the detection coils are arranged, the transport path is disposed to penetrate an opening of the substrate, and the at least one but not all of the detection coils is a detection coil corresponding to a position on the coin apart from the center of the coin by a predetermined distance when the center of the coin passes through the opening.

In the first aspect of the present invention, the number of the at least one but not all of the detection coils is one or two.

In the first aspect of the present invention, the magnetism detection device further comprises an exciting coil configured to generate a magnetic field in the transport path, the detection coils include reflective detection coils arranged on the same side as the exciting coil relative to the transport surface and transmissive detection coils on the side opposite to the exciting coil relative to the transport surface, and the controller is configured to detect a magnetic feature of the coin based on an output signal of at least one but not all of the reflective detection coils and an output signal of at least one but not all of the transmissive detection coils.

In the first aspect of the present invention, the magnetism detection device further comprises a substrate on which the detection coils are arranged, the transport path is disposed to penetrate an opening of the substrate, and the at least one but not all of the reflective detection coils and the at least one but not all of the transmissive detection coils are detection coils each corresponding to a center portion of the coin when the center of the coin passes through the opening.

In the first aspect of the present invention, the magnetism detection device is designed to have a variable size in accordance with at least one of the use of the magnetism detection device or the type of a device on which the magnetism detection device is to be mounted.

In the first aspect of the present invention, the transport path is designed to have a variable width in accordance with at least one of the use of the magnetism detection device or the type of a device on which the magnetism detection device is to be mounted.

In the first aspect of the present invention, the magnetism detection device further comprises: a housing that accommodates the detection coils; and a component that defines both ends of the transport path in the width direction of the transport path.

In the first aspect of the present invention, the magnetism detection device has a left-right asymmetrical shape on one side of the transport surface with the transport surface being horizontally placed and observed along the transport direction.

In the first aspect of the present invention, the controller is configured to select the at least one but not all of the detection coils based on all output signals of the detection coils.

In the first aspect of the present invention, the at least one but not all of the detection coils is a detection coil determined before detection of a magnetic feature of the coin in accordance with the type of the coin.

In the first aspect of the present invention, the coin has a through hole, the detection coils include one or more detection coil groups each including two or more detection coils arranged at constant pitches, and two or more consecutive detection coils of each detection coil group are within a region having the same size as the through hole in a plan view of the transport surface.

In the first aspect of the present invention, the coin is a bicolor coin including a core at a center portion and a ring at a peripheral portion, the core and the ring being made of different materials, the detection coils include one or more detection coil groups each including two or more detection coils arranged at constant pitches, and two or more consecutive detection coils of each detection coil group are within a region having the same width as the ring in a plan view of the transport surface.

In the first aspect of the present invention, each of the detection coils is a coil chip inductor.

In the first aspect of the present invention, the coil chip inductor has a width of 0.3 mm or greater and 3.0 mm or smaller in a direction crossing the transport direction.

A second aspect of the present invention a coin recognition device comprising: the above magnetism detection device; and a recognizer configured to recognize the coin based on a detection result from the magnetism detection device.

A third aspect of the present invention is a method for detecting magnetism using a magnetism detection device that includes a controller and detection coils arranged on at least one side of a transport surface of a transport path on which a coin is to be transported and along a direction crossing a transport direction of the coin, the method comprising detecting a magnetic feature of the coin by the controller based on an output signal of at least one but not all of the detection coils.

Advantageous Effects of Invention

The magnetism detection device, the coin recognition device, and the method for detecting magnetism using the magnetism detection device of the present invention are capable of improving the ability to detect magnetic features of coins and reducing a change in outputs due to a change in transport positions of coins.

BRIEF DESCRIPTION OF THE DRAWINGS

FIG. 2 includes schematic views of an exemplary bi-metallic coin (bicolor coin) that can be handled by the coin recognition device of Embodiment 1 of the present invention; FIG. 2(a) is a schematic plan view and FIG. 2(b) is a schematic, cross-sectional view.

FIG. 3 includes schematic views of an exemplary bi-metallic coin (clad coin) that can be handled by the coin recognition device of Embodiment 1 of the present invention; FIGS. 3(a) and 3(c) are schematic plan views and FIGS. 3(b) and 3(d) are schematic cross-sectional views.

FIG. 4(a) is a schematic plan view and FIG. 4(b) is a schematic cross-sectional view.

FIG. 8 includes graphs of the results of detecting the magnetic features of 7 denominations of the Japanese yen using the magnetism detection device used in the coin recognition device of Embodiment 1 of the present invention; FIG. 8(a) is a graph of results of detecting the magnetic features utilizing the sum of all detection coils and FIG. 8(b) is a graph of the results of detecting the magnetic features utilizing a specific one detection coil apart from the coin edges by the same distance.

FIG. 15 includes schematic views of the positional relationships of coins and the transmissive detection coils the magnetism detection device used in the coin recognition device of Embodiment 1 of the present invention; FIG. 15(a) is a figure relating to coins of a country A and FIG. 15(b) is a figure relating to coins of a country B.

FIG. 19 includes figures of a magnetism detection device used in a coin recognition device of Modification 4 of Embodiment 1 of the present invention; FIG. 19(a) is a schematic view of the relationship between a coin having a through hole in a plan view and reflective detection coils in a plan view of the transport path and FIG. 19(b) is a schematic view of the relationship between a coin having a through hole in a plan view and transmissive detection coils in a plan view of the transport path.

FIG. 20 includes figures of a magnetism detection device used in a coin recognition device of Modification 5 of Embodiment 1 of the present invention; FIG. 20(a) is a schematic view of the relationship between a bicolor coin in a plan view and reflective detection coils in a plan view of a transport path and FIG. 20(b) is a schematic view of the relationship between a bicolor coin in a plan view and transmissive detection coils in a plan view of the transport path.

FIG. 22 includes schematic views of the positional relationships of coins and transmissive detection coils in a conventional magnetism detection device; FIG. 22(a) is a figure relating to coins of a country A and FIG. 22(b) is a figure relating to coins of a country B.

DESCRIPTION OF EMBODIMENTS

Embodiment 1

Hereinafter, a preferred embodiment of the magnetism detection device, the coin recognition device, and the method for detecting magnetism using the magnetism detection device of the present invention is described in detail with reference to the drawings. The magnetism detection device and the method for detecting magnetism using the magnetism detection device of the present embodiment are utilized for detecting magnetic features of coins in the coin recognition device.

Figure 1:
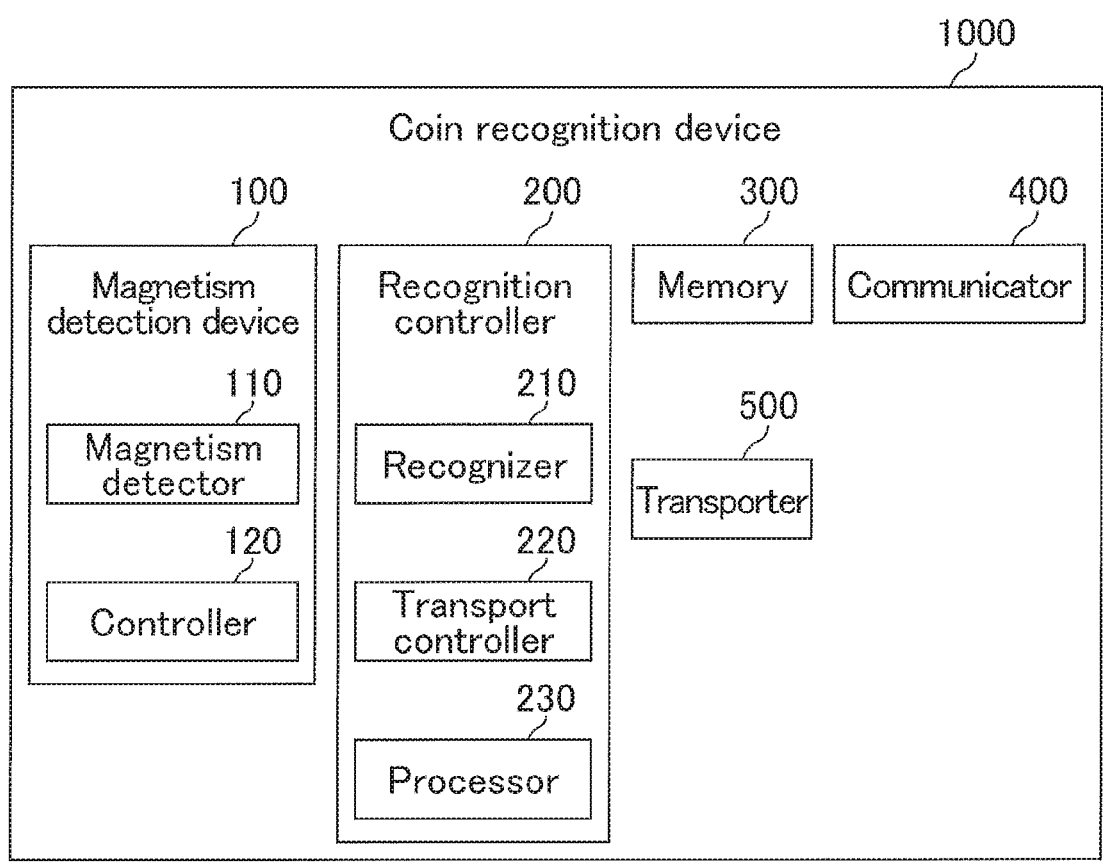
FIG. 1 is a function block diagram of a coin recognition device of Embodiment 1 of the present invention.

As illustrated in FIG. 1, a coin recognition device 1000 of the present embodiment includes a magnetism detection device 100, a recognition controller 200, a memory 300, a communicator 400, and a transporter 500.

The magnetism detection device 100 is configured to apply a magnetic field to a coin under transport along a transport path and to detect a magnetic feature of the coin based on an output signal based on an induced voltage induced by this magnetic field.

The magnetism detection device 100 includes a magnetism detector 110 and a controller 120. The magnetism detector 110 includes a mutual induction-type magnetism sensor. The controller 120 is configured to control the magnetism detection device 100 and to detect a magnetic feature of a coin based on an output from the magnetism detector 110. The controller 120 is also configured to output the detected magnetic feature of the coin to the recognition controller 200.

The recognition controller 200 is configured to recognize the information such as the type (denomination) of a coin to be detected based on the magnetic feature detected by the magnetism detection device 100.

As illustrated in FIG. 1, this recognition controller 200 may include a recognizer 210, a transport controller 220, and a processor 230, for example.

The controller 120 and the recognition controller 200 are each composed of software programs for performing a variety of processes, a CPU configured to execute the software programs, a variety of hardware components controlled by the CPU, and a logical device such as a field programmable gate array (FPGA). For storage of the software programs and data necessary for operation of the components, components such as the memory 300, a separately provided memory, including RAM or ROM, and hard disks are used.

The recognizer 210 has a function of comparing the magnetic feature detected by the magnetism detection device 100 and the reference value of a coin to be detected stored preliminarily in the memory 300, for example, to specify the information such as the type of the coin.

Figure 4:
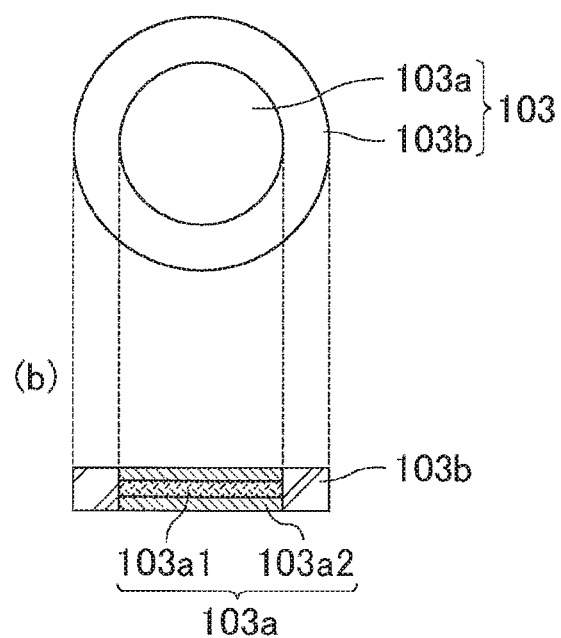
FIG. 4 includes schematic views of an exemplary bi-metallic coin (bicolor clad coin) that can be handled by the coin recognition device of Embodiment 1 of the present invention.

Examples of the coin include those made of a single material, i.e., mono-metallic coins and those made of two or more materials, i.e., bi-metallic coins. Bi-metallic coins include a bicolor coin 101 as illustrated in FIGS. 2(a) and 2(b), a clad coin 102 as illustrated in FIGS. 3(a) to 3(d), and a bicolor clad coin 103 as illustrated in FIGS. 4(a) and 4(b). As illustrated in FIGS. 2(a) and 2(b), the bicolor coin 101 includes a core 101a at a center portion and a ring 101b at a peripheral portion, the core and the ring being made of different materials. The clad coin 102 includes a core material 102a at a center portion and a surface layer 102b covering the core material 102a, the core material and the surface layer being made of different materials. Examples of the clad coin 102 include those obtained by plating a circular core material (base material) 102a and stamping a design thereon as illustrated in FIGS. 3(a) and 3(b) and those obtained by punching a three-layer plate into a circle and stamping a design on the punched circle as illustrated in FIGS. 3(c) and 3(d). As illustrated in FIGS. 4(a) and 4(b), the bicolor clad coin 103 is formed by fitting a core 103a having a clad coin structure into a ring 103b made of a material that is different from the material of the core 103a. The core 103a of the bicolor clad coin 103 includes a core material 103a1 at a center portion and a surface layer 103a2 covering the core material 103a1, the core material and the surface layer being made of different materials.

The transport controller 220 is configured to control the transporter 500 of the coin recognition device 1000.

The processor 230 is configured to execute a variety of processes necessary for operation of the components.

The memory 300 includes memory elements such as volatile or non-volatile memories and hard disks, and is used to store a variety of data necessary for the processes performed in the coin recognition device 1000.

The memory 300 is configured to store the recognition results by the recognition controller 200. The memory 300 also stores a variety of reference values to be used in processing such as coin recognition processing and the information relating thereto.

The communicator 400 has a function of receiving a signal from the outside of the coin recognition device 1000 and sending a signal from the coin recognition device 1000 to the outside.

In response to a signal from the outside, this communicator 400 can, for example, changes the operation settings of the controller 120 and the recognition controller 200, perform processing such as update, addition, and deletion of the software programs or data stored in the memory 300, and output the coin recognition results by the coin recognition device 1000 to the outside.

The transporter 500 includes a transport mechanism for transporting coins. Examples of the transport mechanism include transport element such as fins and transport belts.

Figure 5:
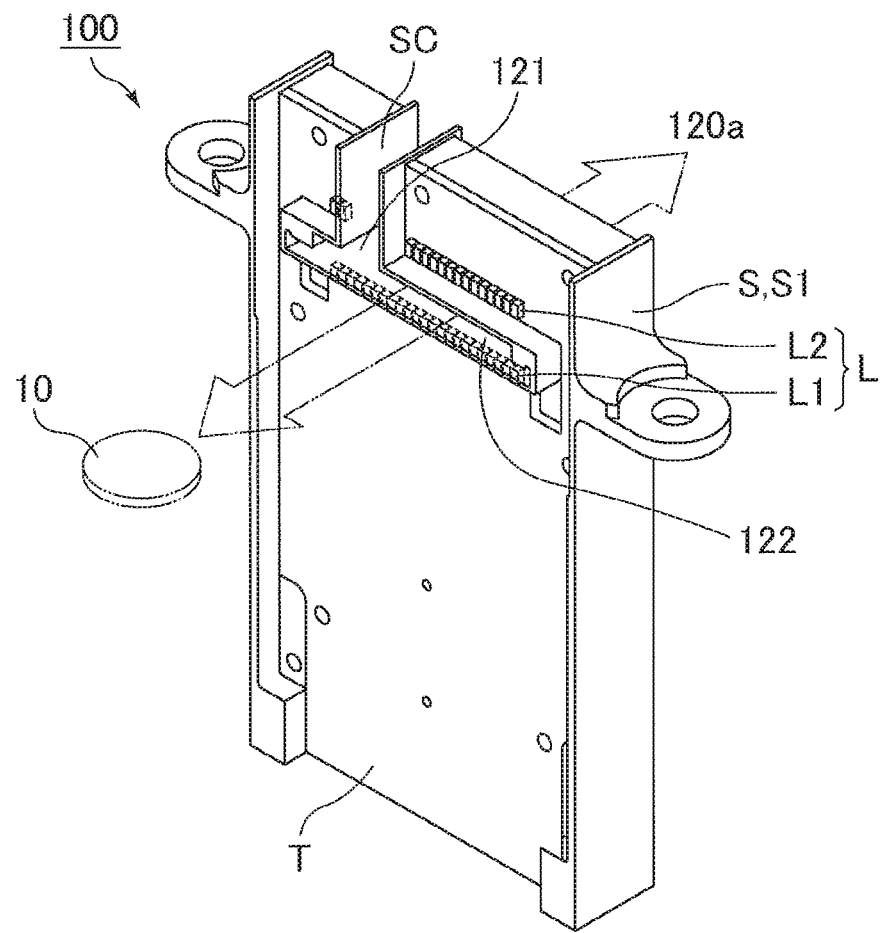
FIG. 5 is a schematic perspective view of a magnetism detection device used in the coin recognition device of Embodiment 1 of the present invention with a cover of a housing and a spacer being detached.
Figure 6:
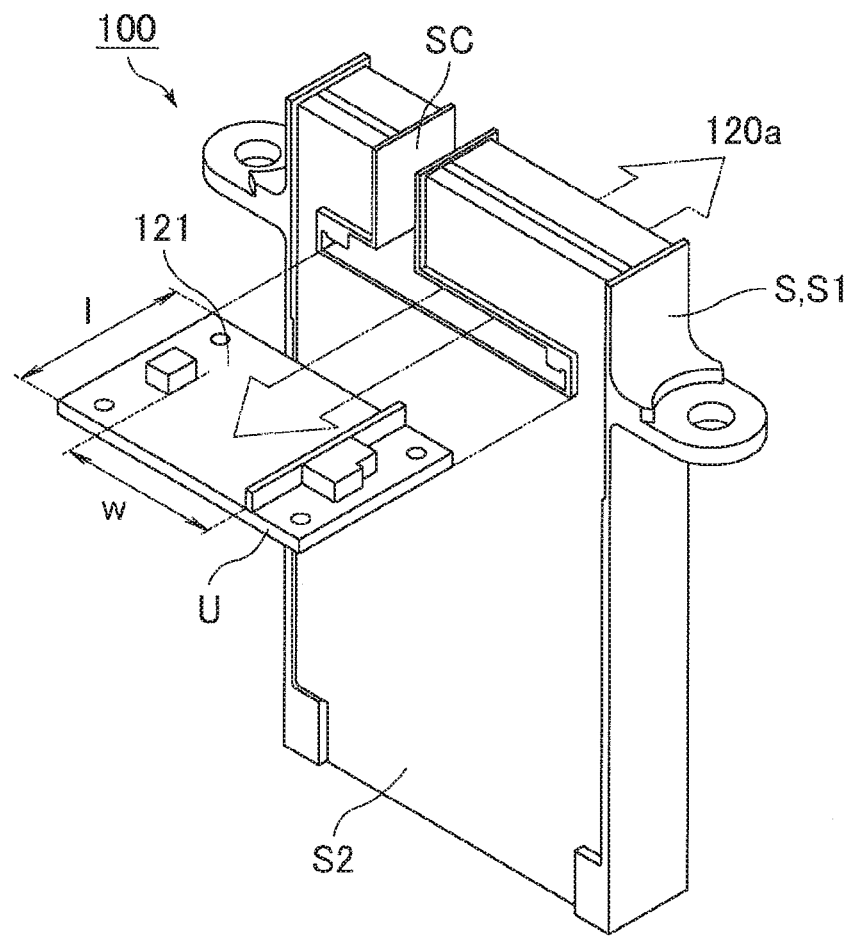
FIG. 6 is a schematic perspective view of the magnetism detection device used in the coin recognition device of Embodiment 1 of the present invention with the spacer being under insertion.
Figure 7:
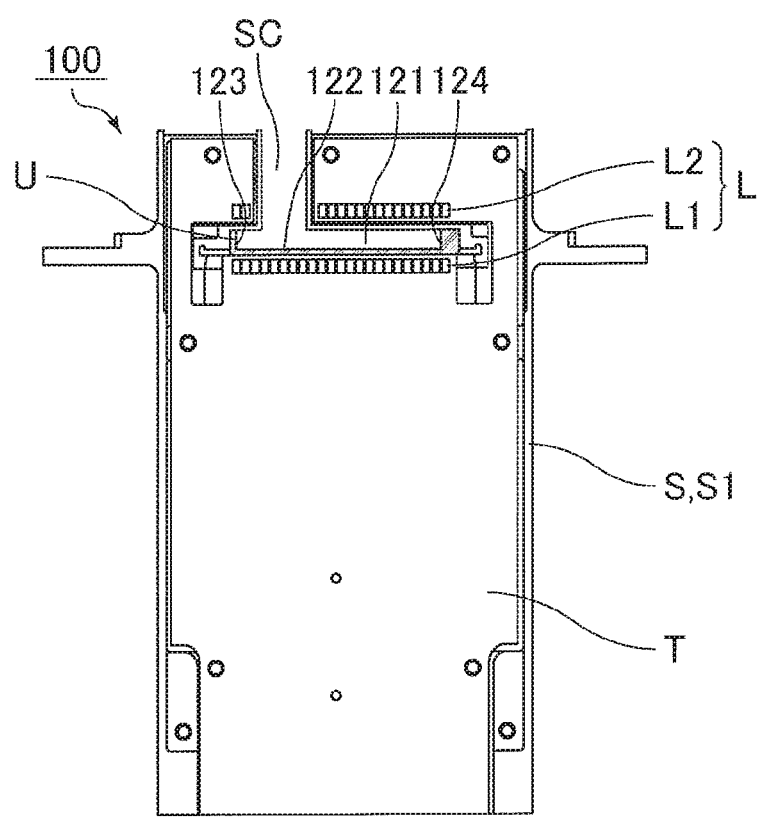
FIG. 7 is a schematic view of the magnetism detection device used in the coin recognition device of Embodiment 1 of the present invention observed in the transport direction of a coin with the cover of the housing being detached.

The magnetism detection device 100 is described in detail below. As illustrated in FIG. 5 to FIG. 7, the magnetism detection device 100 further includes a transport path 121 on which a coin 10 is transported in a transport direction 120a, a substrate T, detection coils L mounted and arranged on the substrate T, a case S1 and a cover S2 of a housing S that accommodates the substrate T and the detection coils L, and a component (hereinafter, also referred to as a spacer) U that defines both ends of the transport path 121 in the width direction of the transport path 121. The spacer U is fit in the coin recognition device 1000 with a fixing member such as a screw. In FIG. 5, the spacer U is not illustrated.

The magnetism detection device 100 has a shape including a gap (hereinafter, also referred to as a gate) SC for placing a transport element (not illustrated) at an upper portion. The rectangular space below the gate SC corresponds to the transport path 121 for a coin 10. The transport path 121 of the magnetism detection device 100 constitutes part of the whole transport path of the coin recognition device 1000. The spacer U constitutes a smooth transport surface 122 supporting the lower face of a coin 10, a one-side alignment surface 123 which is to be in contact with the circumferential surface of the coin 10 to align and guide the coin 10, and a counter alignment surface 124 positioned opposite to the one-side alignment surface 123. The transport surface 122 is rectangular and is greater than the coin 10 having the greatest diameter among the coins 10 to be recognized. In the transport path 121 including an abrasion-resistant plate made of ceramic such as zirconia is generated a magnetic field by an exciting coil to be described later.

Preparing the spacer U as a component separate from the housing S, as illustrated in FIG. 6, for example, enables any setting of the positional relationships of the structures relating to transport of a coin 10, such as the position of the one-side alignment surface 123, the width w, length l, and position of the transport path 121, and the position of the gate SC. Thus, the magnetism detection device 100 can support the requirements specification of a variety of detector-carrying devices. These positional relationships of the structures can be set without changing the shape of the substrate T on which the detection coils L are mounted and the position at which the magnetism detection device 100 is mounted on a detector-carrying device. This can stabilize the detection ability of the magnetism detection device 100 and the recognition ability (quality) of the coin recognition device 1000 based thereon.

As illustrated in FIG. 7, in the present embodiment, the magnetism detection device 100 has a left-right asymmetrical shape on one side, preferably on the upper side, of the transport surface 122 with the transport surface 122 being horizontally placed and observed along the transport direction 120a (hereinafter, simply referred to as "in a front view").

Such an embodiment enables mounting of the magnetism detection device 100 on a detector-carrying device by two fitting methods which are reversed relative to the transport direction 120a for a coin 10. This enables more flexible setting of the positional relationships of the structures relating to transport of a coin 10, such as the position of the one-side alignment surface 123, the width w, length l, and position of the transport path 121, and the position of the gate SC. Thus, the magnetism detection device 100 can support the requirements specification of a variety of detector-carrying devices. These fitting methods can be selected without changing the shape of the substrate T on which the detection coils L are mounted and the position at which the magnetism detection device 100 is mounted on a detector-carrying device. This can stabilize the detection ability of the magnetism detection device 100 and the recognition ability (quality) of the coin recognition device 1000 based thereon.

The left-right asymmetrical shape is specifically preferably the outer shape of the magnetism detection device 100 on the same side as a coin 10 to be transported relative to the transport surface 122 in a front view, i.e., the outer shape of the housing S. The magnetism detection device 100 preferably has the gate SC at a position deviated from the center on one side, preferably on the upper side, of the transport surface 122 in a front view. The gate SC is a notch in the magnetism detection device 100A in which a transport element is placed and which defines the space where the transport element moves in transport of a coin 10.

Coins 10 are transported one by one at intervals on the transport path 121 by the transport element of the transporter 500. The coins 10 slide on the transport surface 122 while being aligned along one end on the one-side alignment surface 123 of the transport path 121, i.e., while being in contact with the one-side alignment surface 123. In the present embodiment, the upper and lower sides of the transport surface 122 of the transport path 121 are each provided with a plurality of the detection coils L. The detection coils L include reflective detection coils L1 disposed on the lower side of the transport surface 122 and transmissive detection coils L2 disposed on the upper side of the transport surface 122.

The detection coils L are arranged in a direction crossing the transport direction 120a for a coin 10, preferably in the direction perpendicular thereto. The reflective detection coils L1 are arranged in a single line and the transmissive detection coils L2 are arranged in a single line, each line being parallel to the transport surface 122. Such arrangement of the detection coils L in a direction crossing the transport direction 120a for a coin 10 on both the upper and lower sides of the transport surface 122 of the transport path 121 allows the detection coils L to output signals (magnetic signals) relating to a magnetic feature of a coin 10 under transport in the respective areas.

When a coin 10 is transported on the transport path 121, an exciting coil to be described later generates a magnetic field in the transport path 121 and this magnetic field induces an induced voltage. Based on this induced voltage, each detection coil L outputs an output signal.

The controller 120 is configured to detect a magnetic feature of a coin 10 based on an output signal of at least one but not all of the reflective detection coils L1 and to detect a magnetic feature of the coin 10 based on an output signal of at least one but not all of the transmissive detection coils L2 among the detection coils L. This enables detection of a magnetic feature of the coin 10 based on the output signal of a detection coil L having a higher degree of overlapping the coin 10 among the output signals of multiple areas. As a result, this can reduce an influence of the diameter of the coin 10 and improve the ability to detect a magnetic feature (e.g., material feature) of the coin 10. This can also reduce a change in outputs due to a change in transport positions of coins 10 caused by, for example, alignment failure.

Referring to FIG. 8, an effect of detecting a magnetic feature of a coin 10 based on a detection coil L having a higher degree of overlapping the coin 10 is described in detail below.

When a coin 10 is transported into the magnetic field generated by the exciting coil, an eddy current loss occurs. The amount of this eddy current loss differs from material to material of the coin 10. A material having a higher conductivity causes a higher eddy current loss, resulting in a lower output voltage of the detection coil L. For example, the current 500-yen coin made of nickel-brass has a higher conductivity than the former 500-yen coin made of cupronickel, and thus the current 500-yen coin has a lower output voltage.

When the magnetic features of the respective Japanese coins are detected using the sum of all of the detection coils L, the magnetic features to be output are influenced by the coin diameter. As illustrated in FIG. 8(*a*), the 10-yen coin having a lower conductivity than the 1-yen coin exhibits an attenuated output voltage.

In contrast, when the magnetic features are detected using a single specific detection coil L as in the present embodiment, the output voltage of each coin roughly corresponds to the conductivity of the coin as illustrated in FIG. 8(*b*). Thus, such a structure can reduce the influence by the coin diameter and can improve the ability to detect magnetic features of coins.

Figure 9:
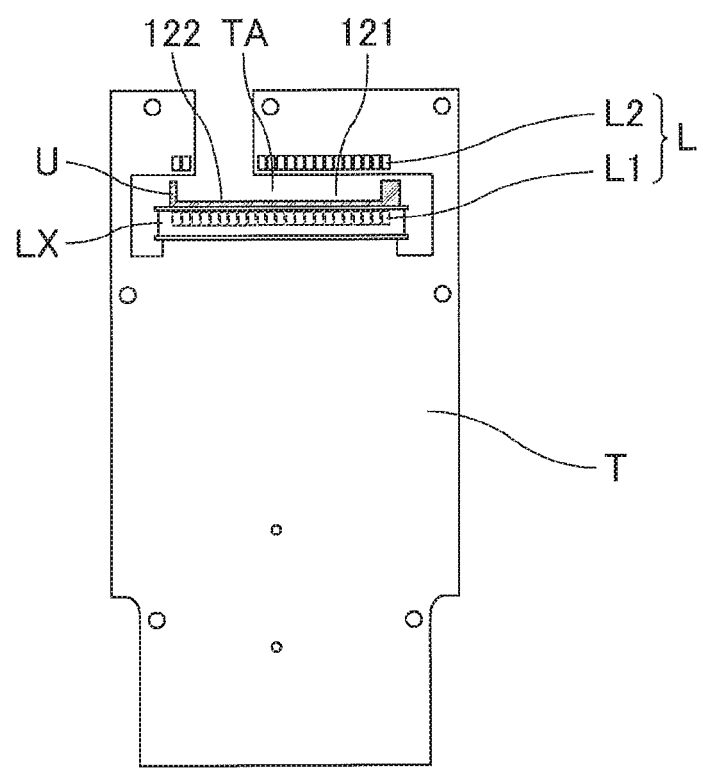
FIG. 9 is a schematic view of a substrate and the spacer of the magnetism detection device used in the coin recognition device of Embodiment 1 of the present invention observed in the transport direction of a coin.
Figure 10:
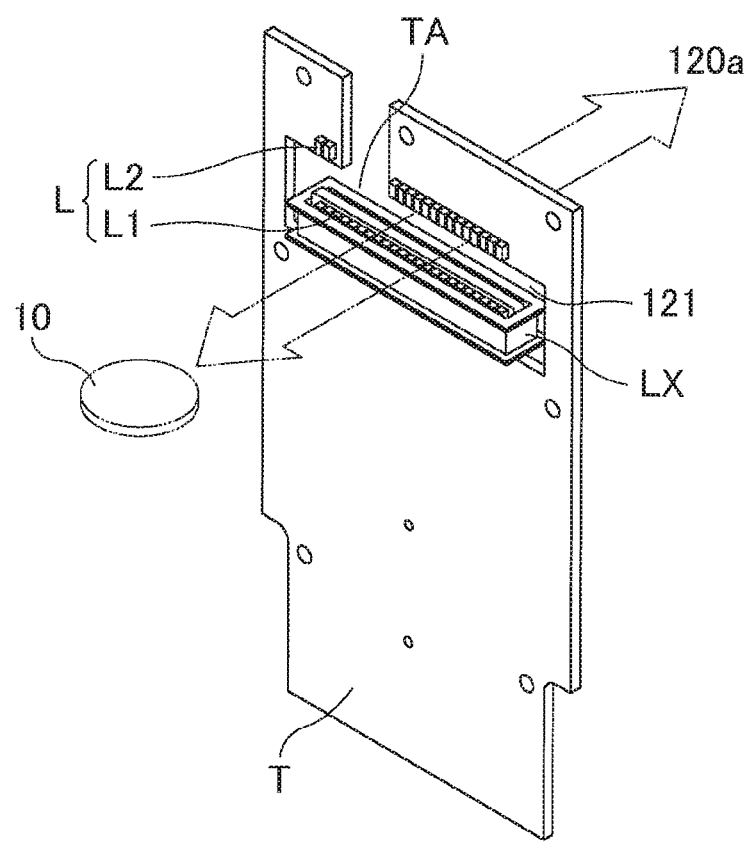
FIG. 10 is a schematic perspective view of the substrate of the magnetism detection device used in the coin recognition device of Embodiment 1 of the present invention.

As illustrated in FIG. 9 and FIG. 10, the substrate T is provided with an opening TA, and the transport path 121 is disposed to penetrate the opening TA.

As illustrated in FIG. 9, on the substrate T is further disposed an exciting coil LX on the same side as the reflective detection coils L1 relative to the transport surface 122. The exciting coil LX is configured to generate a magnetic field in the transport path 121 in response to application of AC voltage. The exciting coil LX is a single coil. Preparing the exciting coil LX as a single coil can lead to a simplified processing circuit. In other words, this structure can eliminate the necessity for a measure to crosstalk of detection signals. The exciting coil LX may be composed of a plurality of coils (primary coils).

Each of the reflective detection coils L1 may be coiled around a detection core, for example. When a coin 10 passes through the transport path 121, a magnetic field generated by the exciting coil LX is reflected on the coin 10. Each reflective detection coil L1 is configured to induce an induced voltage based on this reflected magnetic field and to output an output signal based on this induced voltage.

The exciting coil LX is coiled so as to surround all reflective detection coils L1. The detection cores of the reflective detection coils L1 are collectively shared as the excitation core of the exciting coil LX. The exciting coil LX receives an AC voltage of a single frequency or of multiple frequencies from an AC power source Z to be described later, and thereby generates a magnetic field.

Each of the transmissive detection coils L2 may be coiled around a detection core, for example. When a coin 10 passes through the transport path 121, a magnetic field generated by the exciting coil LX transmits the coin 10. Each transmissive detection coil L2 is configured to induce an induced voltage based on this transmitted magnetic field and to output an output signal based on this induced voltage.

Appropriate setting of the frequency of the AC voltage applied to the exciting coil LX allows the output signals (hereinafter, also referred to as reflection signals) of the reflective detection coils L1 to be outputs corresponding to the material of the surface of the coin 10 and allows the output signals (hereinafter, also referred to as transmission signals) of the transmissive detection coils L2 to be outputs relating to the whole material of the coin 10. In the present embodiment, the AC voltage used may have a frequency of several kilohertz to several megahertz.

Figure 11:
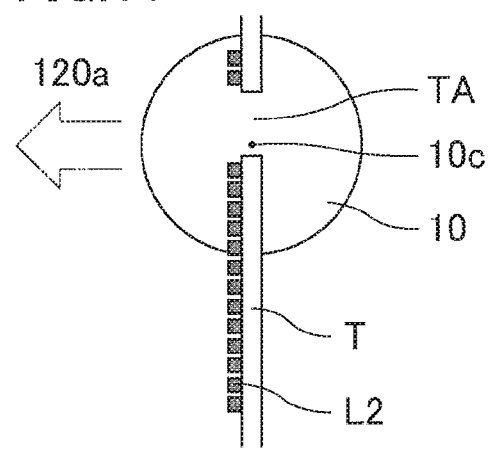
FIG. 11 is a schematic plan view of the magnetism detection device used in the coin recognition device of Embodiment 1 of the present invention with the center of a coin passing through an opening of the substrate observed from the top of a transport path.

The at least one but not all of the reflective detection coils L1 is preferably a detection coil L corresponding to a position on a coin 10 inside from an edge of the coin 10 by a predetermined distance when a center 10*c* of the coin 10 passes through the opening TA of the substrate T, as illustrated in FIG. 11. The same applies to the at least one but not all of the transmissive detection coils L2. Such an embodiment enables continuous output of a signal of an area at a certain distance from an edge of the coin 10 regardless of the diameter of the coin 10 and the transport position of the coin 10. This enables more stable detection of a magnetic feature of the coin 10.

The following gives an exemplary processing workflow of selecting a detection coil L corresponding to a position on a coin 10 inside from an edge of the coin 10 by a predetermined distance by the controller 120. The following processing workflow is described with reference to FIG. 12. This processing workflow is performed on each of the group of the reflective detection coils L1 and the group of the transmissive detection coils L2.

(1-1) First, the outputs of all detection coils L are collected.

(1-2) Then, the diameter of the coin 10 is detected. Specifically, the detection coil L at the outermost position is detected among the detection coils L overlapping the coin 10, i.e., the detection coils L having an output change, and thereby the diameter of the coin 10 is detected. At this time, the position of the detection coil L at the outermost position may be compared with the reference value in the memory 300 to recognize the denomination.

The detection coil L at the outermost position may be determined by any of the following methods:

a) a method of detecting the detection coil L having the smallest output change;

b) a method of detecting the detection coil L whose output change starts the latest;

c) a method of detecting a detection coil L (detection coil L having an output change) adjacent to a detection coil L having no output change;

or by any combination of these methods. The output change is preferably an output decrease.

(1-3) Finally, based on the diameter of the coin 10 detected in the above step (1-2), the detection coil L corresponding to a position on the coin 10 inside from an edge of the coin 10 by a predetermined distance is determined, which is defined as the detection coil L for detecting the material of the coin 10.

The at least one but not all of the reflective detection coils L1 is also preferably a detection coil L corresponding to a position apart from the center 10*c* of the coin 10 by a predetermined distance when the center 10*c* of the coin 10 passes through the opening TA of the substrate T. The same applies to the at least one but not all of the transmissive detection coils L2. Such an embodiment enables continuous output of a signal of an area at a certain distance from the center 10*c* of the coin 10, even when the coin 10 is provided with an opening (through hole) at the center 10*c*, regardless of the diameter of the coin 10 and the transport position of the coin 10. This enables more stable detection of a magnetic feature of the coin 10.

The following gives an exemplary processing workflow of selecting a detection coil L corresponding to a position apart from the center 10*c* of the coin 10 by a predetermined distance by the controller 120. The following processing workflow is described with reference to FIG. 12. This processing workflow is performed on each of the group of the reflective detection coils L1 and the group of the transmissive detection coils L2.

(2-1) First, the outputs of all detection coils L are collected.

(2-2) Then, the center 10*c* of the coin 10 is detected. Specifically, the detection coil L whose output change starts at first among all detection coils L is detected as the detection coil L positioned at the center 10*c*. Alternatively, toe diameter of the coin 10 may be detected as described above before detection of the detection coil L positioned at the center 10*c* of the coin 10.

(2-3) Finally, based on the center 10*c* of the coin 10 detected in the above step (2-2), the detection coil L corresponding to a position apart from the center 10*c* of the coin 10 by a predetermined distance is determined, which is defined as the detection coil L for detecting the material of the coin 10.

Figure 12:
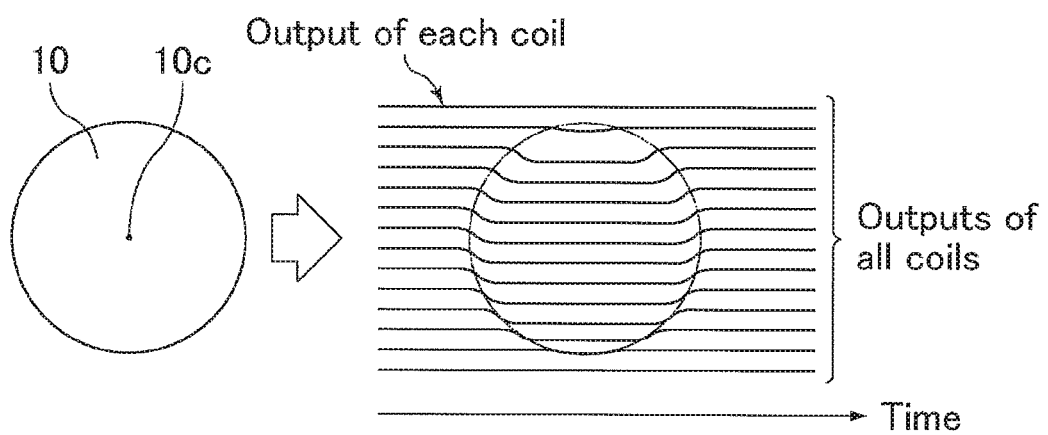
FIG. 12 is a schematic view of the outputs of the respective detection coils in the magnetism detection device used in the coin recognition device of Embodiment 1 of the present invention.

As illustrated in FIG. 12, selecting the at least one but not all of the reflective detection coils L1 based on all output signals of the reflective detection coils L1 enables selection of a reflective detection coil L1 that is particularly suitable for detection of a magnetic feature of a coin 10. This can therefore further improve the ability to detect a magnetic feature of a coin 10. The same applies to the transmissive detection coils L2.

Each of the detection coils L is preferably a coil chip inductor. The coil chip inductor preferably has a width of 0.3 mm or greater and 3.0 mm or smaller in a direction crossing the transport direction 120*a*, preferably the direction perpendicular thereto. Such an embodiment enables secure collection of magnetic signals corresponding to fine portions of a coin 10.

The term "at least one but not all of the detection coils L" (also applied to the reflective detection coils L1 and the transmissive detection coils L2; the same applies to the following) as used herein means one or more detection coils L excluding at least one of the detection coils L, and may be all of the remaining detection coils L excluding one of the detection coils L or may be one detection coil L among a the detection coils L. Still, the term preferably means one or two detection coils L. This is because as follows. In the case of detecting a bicolor coin 101 or a bicolor clad coin 103, an outer edge is present at two positions, i.e., at the core and at the ring. In this case, the device is preferred to have an improved ability to detect a magnetic feature on at least one of the core or the ring. From this viewpoint, the number of the at least one but not all of the detection coils L is more preferably two or greater.

The magnetism detection device 100 is configured to detect a magnetic feature of a coin 10 based on an output signal of at least one but not all of the reflective detection coils L1 and an output signal of at least one but not all of the transmissive detection coils L2. This detection method is also referred to as reflection-transmission comparative detection hereinbelow. As described above, the reflection signal enables detection of the material of the surface of the coin 10 and the transmission signal enables detection of the whole material of the coin 10.

Figure 13:
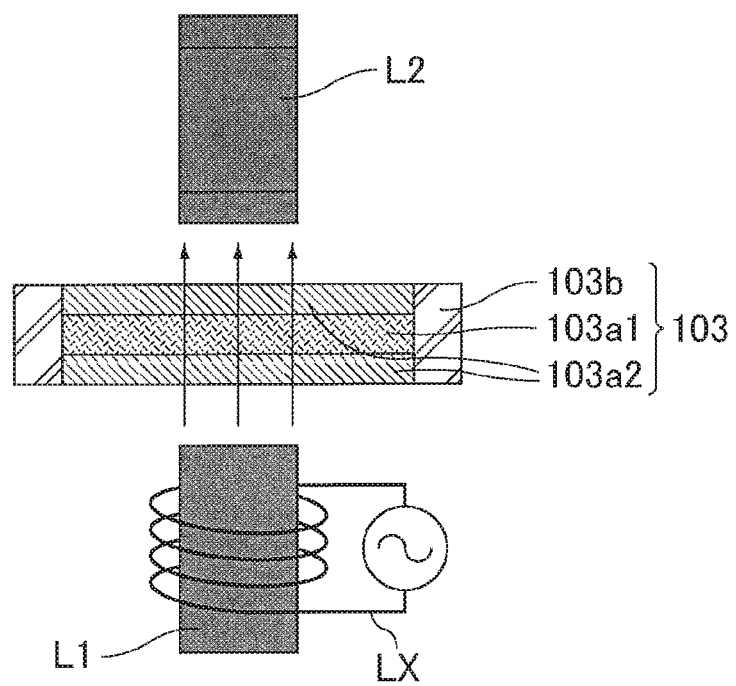
FIG. 13 is a schematic view of a reflective detection coil and a transmissive detection coil of the magnetism detection device used in the coin recognition device of Embodiment 1 of the present invention.

Thus, in the case of distinguishing a bicolor clad coin 103 as illustrated in FIG. 13 and a mono-metallic coin made of the same material as the surface layer 103*a*2 of the bicolor clad coin 103 alone, the reflective detection coils L1 detect the same signals for these coins because the surface layers of the coins are made of the same material, while the transmissive detection coils L2 detect different signals for these coins because the insides of the coins are made of different materials. Accordingly, the reflection-transmission comparative detection enables recognition of a clad structure of a coin 10 even with a single frequency.

Figure 14:
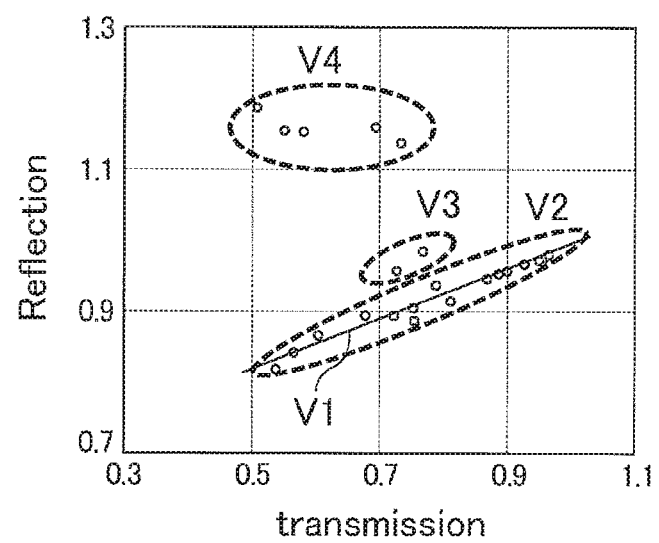
FIG. 14 is a graph of the results of detecting the magnetic features of mono-metallic coins and bi-metallic coins using the magnetism detection device used in the coin recognition device of Embodiment 1 of the present invention.

Specifically, as illustrated in FIG. 14, a coin can be recognized as a mono-metallic coin when having a transmission signal-reflection signal ratio present in a region V2 around a mono-metallic curve V1 on which the transmission signal-reflection signal ratios are similar to each other, while a coin can be recognized as having a clad structure when having a transmission signal-reflection signal ratio present in a region V3 apart from the mono-metallic curve V1. This is because a mono-metallic coin is made of a uniform material, and thus the reflection signal and the transmission signal thereof are outputs corresponding to the conductivity of the material of the mono-metallic coin. In contrast, for a coin having a clad structure, the reflection signal thereof is an output corresponding to the conductivity of the material of the surface layer, while the transmission signal thereof is an output corresponding to the conductivity of the material of the whole clad structure.

When a transmission signal-reflection signal ratio is present in a region V4 where the reflection signal is greater than the transmission signal, the material contained in the clad layer can be recognized as a magnetic material. In other words, the reflection signal-transmission signal ratio enables recognition of the material contained in the clad structure as being either a magnetic material or a nonmagnetic material. This is because the presence of a magnetic material increases the reflection signal and the resulting ratio is greatly apart from the mono-metallic curve V1.

Further, in the reflection-transmission comparative detection, magnetic features of a variety of portions, such as the surface of a coin 10 and the center and the surrounding thereof, can be detected in accordance with the frequencies by generating a magnetic field of the exciting coil LX based not on the AC voltage of a single frequency but on the AC voltage of multiple frequencies. This can easily improve the ability to detect a clad structure of a coin 10.

The at least one but not all of the reflective detection coils L1 and the at least one but not all of the transmissive detection coils L2 in the reflection-transmission comparative detection are preferably detection coils L each corresponding to a center portion of a coin 10 when the center 10*c* of the coin 10 passes through the opening TA of the substrate T. Such an embodiment enables detection of a magnetic feature using a detection coil L having a higher degree of overlapping the coin 10, further improving the ability to detect a material.

The arrangement of the transmissive detection coils L2 is then described below. As illustrated in FIG. 9, the transmissive detection coils L2 are arranged in a left-right asymmetrical manner in a front view. In other words, the transmissive detection coils L2 are arranged as illustrated in FIG. 15 in a plan view from the above of the transport path 121.

Such a left-right asymmetrical arrangement of the transmissive detection coils L2 makes it easy to arrange left and right transmissive detection coils L21 and L22 at portions inside the edges of the coin for both a coin 10S having a smaller diameter and a coin 10L having a larger diameter in both a country A and a country B. This enables detection of a magnetic feature using a transmissive detection coil L2 having a higher degree of overlapping the coin 10, stabilizing the detection ability of the magnetism detection device 100 and the recognition ability (quality) of the coin recognition device 1000 based thereon.

Figure 16:
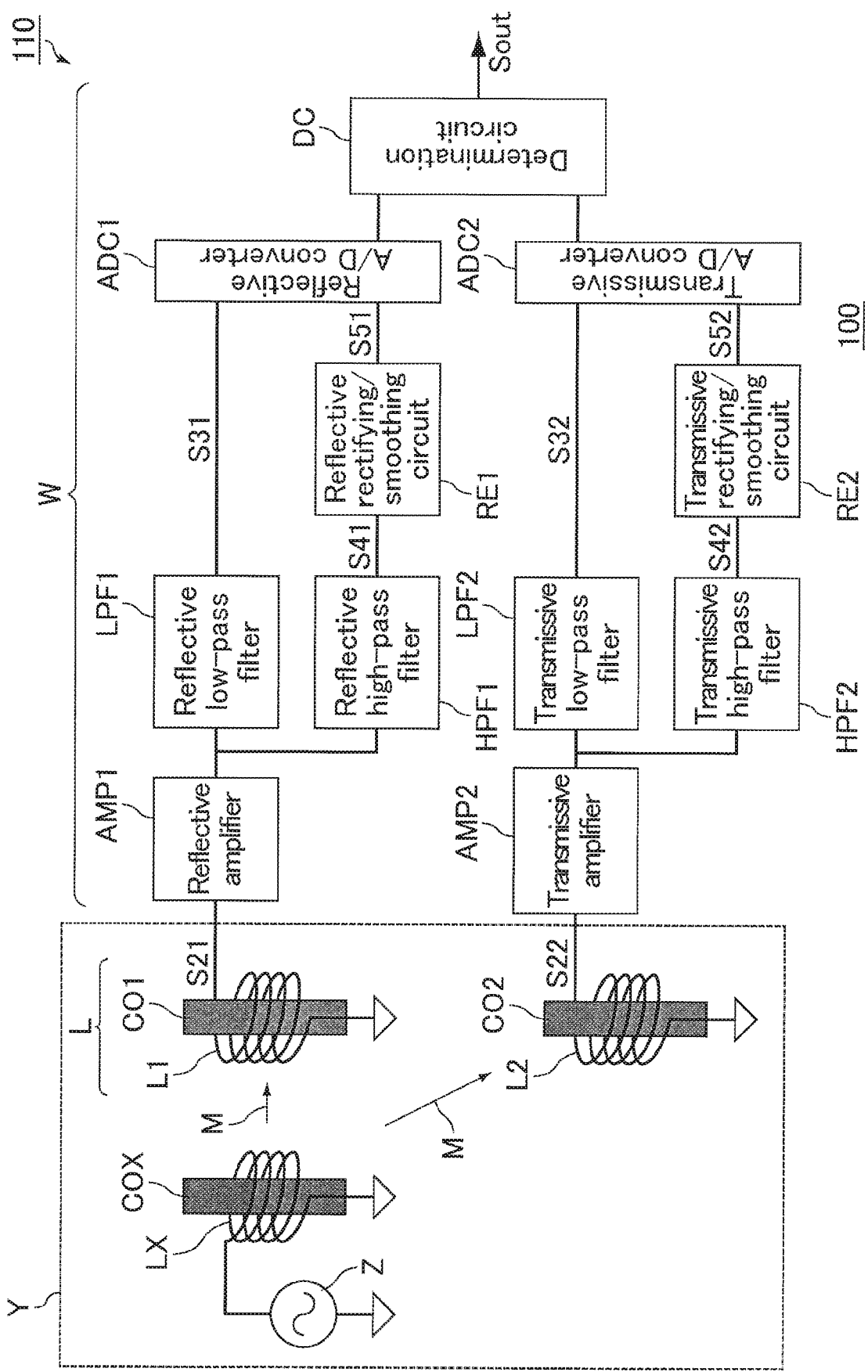
FIG. 16 is a diagram of an exemplary structure of the magnetism detection device used in the coin recognition device of Embodiment 1 of the present invention.

The magnetism detector 110 in Embodiment 1 is described in detail below. As illustrated in FIG. 16, for example, the magnetism detector 110 includes a sensor unit (magnetic sensor unit for coin recognition) Y and a processing unit W.

As illustrated in FIG. 16, for example, the sensor unit Y of the magnetism detector 110 includes an AC power source Z, an exciting coil (primary coil) LX, detection coils (secondary coils) L (L1 and L2), and the substrate T (not illustrated in FIG. 16). Each of the reflective detection coils L1 is coiled around a detection core CO1 and each of the transmissive detection coils L2 is coiled around a detection core CO2.

The AC power source Z is configured to generate an AC voltage Z1. This AC power source Z may be disposed on the substrate T, for example. The AC voltage Z1 may be an AC voltage of a single specific frequency or an AC voltage (synthesized signal) of two or more specific frequencies.

The exciting coil LX is configured to receive the AC voltage Z1 output from the AC power source Z to generate a magnetic field M in the transport path 121.

The exciting coil LX may be coiled to surround the reflective detection coils L1 and the detection cores CO1 around which the respective reflective detection coils L1 are coiled, for example. In this case, an exciting core COX illustrated in FIG. 16 is replaced with the detection cores CO1.

The detection coils L (L1 and L2) are configured to induce an induced voltage by a magnetic field M generated by the exciting coil LX and to output detection signals S21 and S22 based on the induced voltage. The magnetic field M is changed in response to transport of a coin 10 on the transport path 121 to induce an induced voltage. The detection coils L (L1 and L2) are configured to output the detection signals S21 and S22 based on the induced voltage.

The processing unit W of the magnetism detector 110 is configured to obtain the detection signals output from the sensor unit Y, to process these detection signals, and to output a determination signal Sout.

As illustrated in FIG. 16, for example, this processing unit W includes a reflective amplifier AMP1, a reflective low-pass filter LPF1, a reflective high-pass filter HPF1, a reflective rectifying/smoothing circuit RE1, a reflective A/D converter ADC1, a transmissive amplifier AMP2, a transmissive low-pass filter LPF2, a transmissive high-pass filter HPF2, a transmissive rectifying/smoothing circuit RE2, a transmissive A/D converter ADC2, and a determination circuit DC.

The reflective amplifier AMP1 is configured to amplify the detection signal S21 output from the reflective detection coil L1.

The reflective low-pass filter LPF1 is configured to filter the detection signal S21 amplified by the reflective amplifier AMP1 to output a low-frequency component (signal S31) of the amplified detection signal S21.

For example, this reflective low-pass filter LPF1 may hardly attenuate the component having a frequency lower than the predetermined cutoff frequency and may gradually reduce the component having a frequency higher than the cutoff frequency for the amplified detection signal S21.

The reflective high-pass filter HPF1 is configured to filter the detection signal S21 amplified by the reflective amplifier AMP1 to output a high-frequency component (signal S41) of the amplified detection signal S21. This reflective high-pass filter HPF1 may be a band-pass filter (BPF) circuit.

For example, this reflective high-pass filter HPF1 may hardly attenuate the component having a frequency higher than the predetermined cutoff frequency and may gradually reduce the component having a frequency lower than the cutoff frequency for the detection signal S21.

The reflective rectifying/smoothing circuit RE1 is configured to rectify and smooth the signal S41 output from the reflective high-pass filter HPF1 to output a signal S51.

The reflective A/D converter ADC1 is configured to perform analog-to-digital conversion on the signal S31 output from the reflective low-pass filter LPF1 and the signal S51 output from the reflective rectifying/smoothing circuit RE1 to output a digital signal.

The transmissive amplifier AMP2 is configured to amplify the detection signal S22 output from the transmissive detection coil L2.

The transmissive low-pass filter LPF2 is configured to filter the detection signal S22 amplified by the transmissive amplifier AMP2 to output a low-frequency component (signal S32) of the amplified detection signal S22.

For example, this transmissive low-pass filter LPF2 may hardly attenuate the component having a frequency lower than the predetermined cutoff frequency and may gradually reduce the component having a frequency higher than the cutoff frequency for the amplified detection signal S22.

The transmissive high-pass filter HPF2 is configured to filter the detection signal S22 amplified by the transmissive amplifier AMP2 to output a high-frequency component (signal S42) of the amplified detection signal S22. This transmissive high-pass filter HPF2 may be a band-pass filter (BPF) circuit.

For example, this transmissive high-pass filter HPF2 may hardly attenuate the component having a frequency higher than the predetermined cutoff frequency and may gradually reduce the component having a frequency lower than the cutoff frequency for the detection signal S22.

The transmissive rectifying/smoothing circuit RE2 is configured to rectify and smooth the signal S42 output from the transmissive high-pass filter HPF2 to output a signal S52.

The transmissive A/D converter ADC2 is configured to perform analog-to-digital conversion on the signal S32 output from the transmissive low-pass filter LPF2 and the signal S52 output from the transmissive rectifying/smoothing circuit RE2 to output a digital signal.

The determination circuit DC is configured to process the digital signals output from the reflective A/D converter ADC1 and the transmissive A/D converter ADC2 to output a determination signal Sout. Although the processing unit W in the present embodiment performs analog signal processing, the signal processing by the processing unit W may be digital processing.

Modification 1 of Embodiment 1

Figure 17:
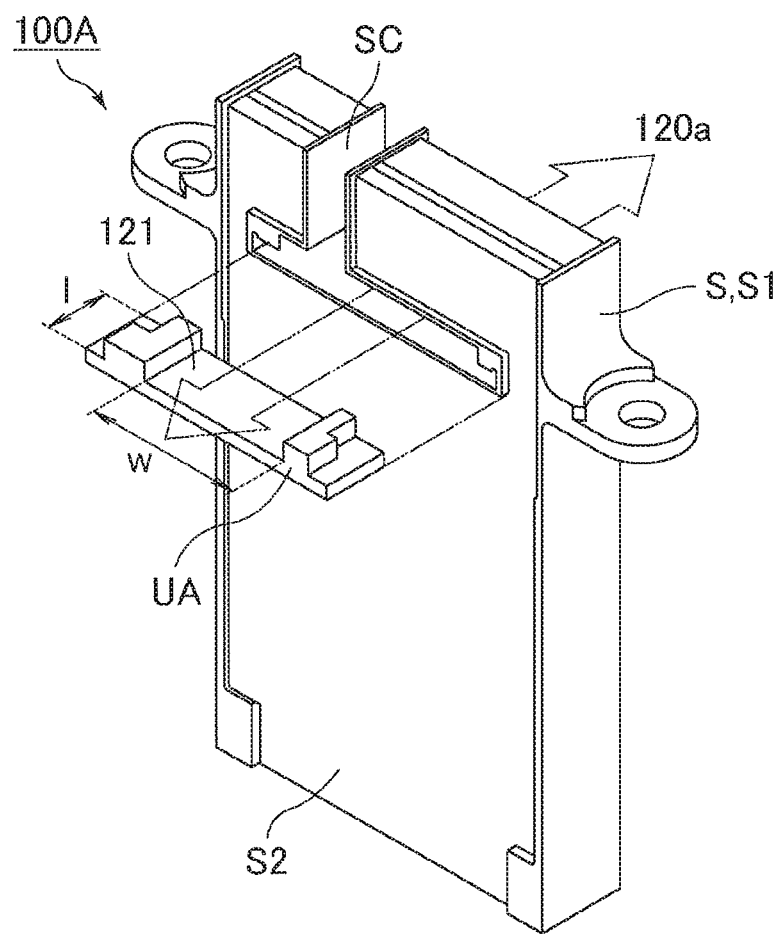
FIG. 17 is a schematic perspective view of a magnetism detection device used in a coin recognition device of Modification 1 of Embodiment 1 of the present invention.

As illustrated in FIG. 17, a magnetism detection device of Modification 1 of Embodiment 1 includes a spacer having a structure different from that of the spacer U of the magnetism detection device 100 of Embodiment 1.

A magnetism detection device 100A of Modification 1 of Embodiment 1 includes a spacer UA having a structure different from that of the spacer U. Thereby, the magnetism detection device 100 of Embodiment 1 and the magnetism detection device 100A of Modification 1 of Embodiment 1 have different structures of the transport path 121.

Figure 18:
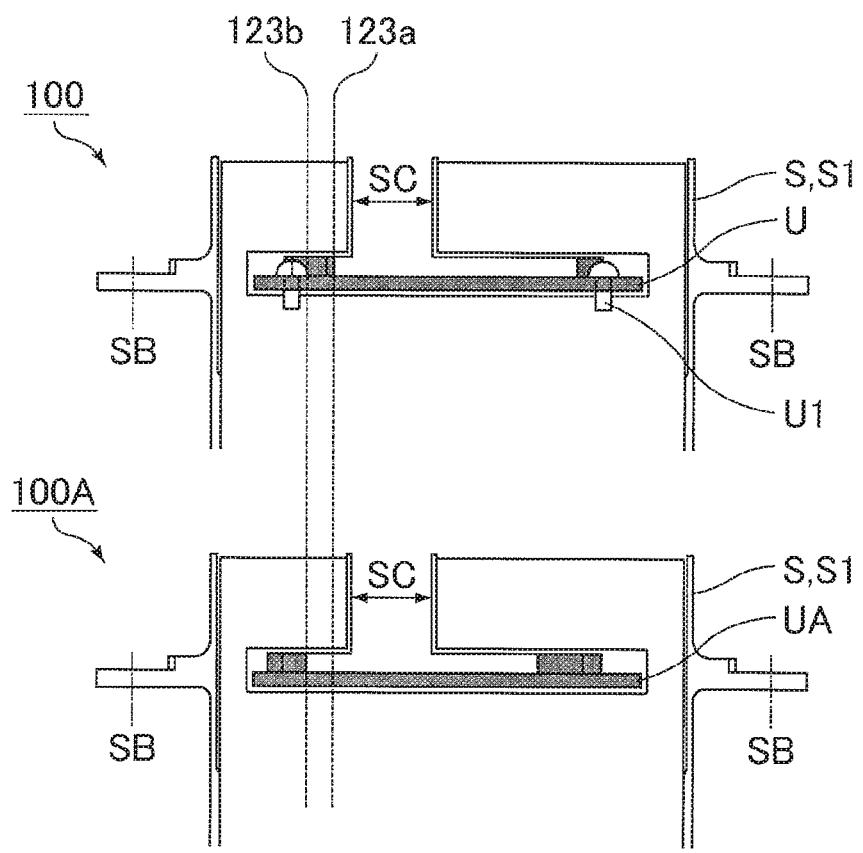
FIG. 18 is a schematic view of the magnetism detection devices used in the coin recognition devices of Embodiment 1 and Modification 1 of Embodiment 1 of the present invention, with the widths of the transport paths being compared.

Specifically, as illustrated in FIG. 18, the one-side alignment surface 123a of the magnetism detection device 100 of Embodiment 1 and a one-side alignment surface 123b of the magnetism detection device 100A of Modification 1 of Embodiment 1 are placed at different positions relative to a fitting reference SB and the gate SC. In FIG. 18, the spacer U is fitted to the coin recognition device 1000 using fixing components U1.

Preparing the spacers U and UA, each of which defines the ends of the transport path 121, as components separate from the housing S in such a manner enables any setting of the positional relationships of the structures relating to transport of a coin 10, such as the position of the one-side alignment surface 123, the width w, length l, and position of the transport path 121, and the position of the gate SC, as described above. Thus, the magnetism detection device 100 can support the requirements specification of a variety of detector-carrying devices. These positional relationships of the structures can be set without changing the shape of the substrate T on which the detection coils L are mounted and the position at which the magnetism detection device 100 or 100A is mounted on a detector-carrying device. This can stabilize the detection ability of the magnetism detection device 100 or 100A and the recognition ability (quality) of the coin recognition device 1000 based thereon.

As described above, the magnetism detection devices 100 and 100A of the present embodiment are each designed to have a variable size in accordance with at least one of the use of the magnetism detection device 100 or 100A or the type of a device on which the magnetism detection device 100 or 100A is to be mounted.

The transport path 121 in each of the magnetism detection devices 100 and 100A of the present embodiment is designed to have a variable width w in accordance with at least one of the use of the magnetism detection device 100 or 100A or the type of a device on which the magnetism detection device 100 or 100A is to be mounted.

Modification 2 of Embodiment 1

The controller 120 of Embodiment 1 collects the outputs of all detection coils L and selects at least one but not all of the detection coils L. When the type of a coin 10 of which a magnetic feature is to be detected is known in advance, the at least one but not all of the detection coils L is also preferably a detection coil L determined in accordance with the type of the coin 10 before detection of the magnetic feature of the coin 10. Such an embodiment can eliminate the need for storing the outputs of all detection coils L in the memory 300, preventing a reduction in the memory capacity of the memory 300. This embodiment can also omit the step of collecting the outputs of all detection coils L and selecting the detection coil L for material detection, improving the processing speed.

Modification 3 of Embodiment 1

In Embodiment 1, each of the upper and lower sides of the transport surface 122 of the transport path 121 is provided with a plurality of the detection coils L. Still, the detection coils L may be disposed on either one side of the transport surface 122, i.e., either one of the two spaces adjacent to each other with the transport surface 122 of the transport path 121 in between. For example, the magnetism detection device 100 may include none of the reflective detection coils L1 or none of the transmissive detection coils L2. Such arrangement of the detection coils L in a direction crossing the transport direction 120a for a coin 10 on at least one side or the transport surface 122 of the transport path 121 allows the detection coils L to output signals relating to a magnetic feature of a coin 10 to be transported in the respective areas.

Modification 4 of Embodiment 1

In Embodiment 1, the detection coils L may be arranged at any intervals. Still, the detection coils L may be arranged at predetermined intervals in accordance with the type of a coin 10 to be transported on the transport path 121.

In the case where the coin 10 is a coin 104 having a through hole 10h as illustrated in FIG. 19(a), preferably, the reflective detection coils L1 include one reflective detection coil group LA1 including two or more reflective detection coils L1 arranged at constant pitches, and two or more consecutive reflective detection coils L1 of the reflective coil group LA1 are within a region $10h_1$ having the same size as the through hole 10h in a plan view of the transport surface 122. Such an embodiment allows the detector to detect the presence or absence of the through hole 10h.

Also in the case where the coin 10 is a coin 104 having a through hole 10h, as illustrated in FIG. 19(b), preferably, the transmissive detection coils L2 include two transmissive detection coil groups LA2 each including two or more transmissive detection coils L2 arranged at constant pitches, and two or more consecutive transmissive detection coils L2 of each transmissive detection coil group LA2 are within the region $10h_1$ having the same size as the through hole 10h in a plan view of the transport surface 122. In this case, the transmissive detection coils L2 are not arranged at constant pitches on the whole, but two or more transmissive detection coils L2 of each transmissive detection coil group LA2 are arranged at constant pitches (the same pitch may be shared by all transmissive detection coil groups LA2). Such an embodiment allows the detector to detect the presence or absence of the through hole 10h.

The through hole 10h is an opening penetrating the coin 104. The phrase "two or more consecutive detection coils (reflective detection coils L1 or transmissive detection coils L2) are with the region $10h_1$ having the same size as the through hole 10h in a plan view" means that two or more consecutive detection coils are arranged such that the region $10h_1$ can be placed so as to entirely cover each of the two or more consecutive detection coils in a plan view of the transport surface 122.

In the case where the coins 10 to be detected include multiple types of coins 104 having through holes 10h of different diameters, two or more consecutive detection coils (reflective detection coils L1 or transmissive detection coils L2) are preferably thin the region 10$h_1$ having the same size as the through hole 10$h$ of the smallest diameter in a plan view.

Modification 5 of Embodiment 1

Modification 4 of Embodiment 1 describes a preferred embodiment in which the coin 10 is a coin 104 having a through hole 10$h$. In the present modification, a preferred embodiment in which the coin 10 is a bicolor coin 101 is described.

In the case where the coin 10 is a bicolor coin 101 including a core 101$a$ at a center portion and a ring 101$b$ at a peripheral portion, with the core and the ring being made of different materials, as illustrated in FIG. 20($a$), preferably, the reflective detection coils L1 include one reflective detection coil group LA1 including two or more reflective detection coils L1 arranged at constant pitches, and two or more consecutive reflective detection coils L1 of the reflective detection coil group LA1 are within a region having the same width w1 as the width w1 of the ring 101$b$ in a plan view of the transport surface 122. Such an embodiment allows the detector to detect a signal of the ring 101$b$ alone.

Also in the case where the coin 10 is a bicolor coin 101, as illustrated in FIG. 20($b$), preferably, the transmissive detection coils L2 include two transmissive detection coil groups LA2 each including two or more transmissive detection coils L2 arranged at constant pitches, and two or more consecutive transmissive detection coils L2 of each transmissive detection coil group LA2 are within a region having the same width w1 as the width w1 of the ring 101$b$ in a plan view of the transport surface 122. Also in this case, the transmissive detection coils L2 are not arranged at constant pitches on the whole, but two or more transmissive detection coils L2 of each transmissive detection coil group LA2 are arranged at constant pitches (the same pitch may be shared by all transmissive detection coil groups LA2). Such an embodiment allows the detector to detect a signal of the ring 101$b$ alone.

The phrase "two or more consecutive detection coils (reflective detection coils L1 or transmissive detection coils L2) are within a region having the same width w1 as the width w1 of the ring 101$b$" means that two or more consecutive detection coils are arranged such that each of the two or more consecutive detection coils can be entirely arranged within a region having the same width w1 as the width w1 of the ring 101$b$.

The width w1 of the ring 101$b$ means the smallest width of the ring 101$b$. In the case where the width w1 of the ring, 101$b$ of the bicolor coin 101 varies at positions, two or more consecutive detection coils (reflective detection coils L1 or transmissive detection coils L2) are preferably within a range having the same width as the smallest width of the ring 101$b$. In the case where the coins 10 to be detected include multiple types of bicolor coins 101 whose rings 101$b$ have different widths w1, two or more consecutive detection coils (reflective detection coils L1 or transmissive detection coils L2) are preferably within a region having the same width w1 as the width w1 of the ring 101$b$ of the bicolor coin 101 having the smallest width w1 of the ring 101$b$.

As described above, the magnetism detection device 100 of the above embodiment comprises the transport path 121 on which a coin 10 is to be transported, and detection coils L arranged on at least one side of the transport surface 122 of the transport path 121 and along a direction crossing the transport direction 120$a$ of the coin 10. This allows the detection coils L to output signals (magnetic signals) relating to a magnetic feature of a coin 10 to be transported in the respective areas.

The magnetism detection device 100 of the above embodiment further includes the controller 120 configured to detect a magnetic feature of the coin 10 based on an output signal from at least one but not all of the detection coils L. This enables detection of a magnetic feature of the coin 10 based on the output signal of a detection coil L having a higher degree of overlapping the coin 10 among the output signals of multiple areas. As a result, this can reduce an influence of the diameter of the coin 10 and improve the ability to detect a magnetic feature (e.g., material feature) of the coin 10. This can also reduce a change in outputs due to a change in transport positions of coins 10 caused by, for example, one-side alignment failure.

The magnetism detection device 100 of the above embodiment further comprises the substrate T on which the detection coils L are arranged, the transport path 121 is disposed to penetrate the opening TA of the substrate T, and the at least one but not all of the detection coils is a detection coil L corresponding to a position on the coin 10 inside from an edge of the coin 10 by a predetermined distance when the center 10$c$ of the coin 10 passes through the opening TA. This enables continuous output of a signal of an area at a certain distance from an edge of the coin 10 regardless of the diameter of the coin 10 and the transport position of the coin 10. This enables more stable detection of a magnetic feature of the coin 10.

The magnetism detection device 100 of the above embodiment further comprises the substrate T on which the detection coils L are arranged, the transport path 121 is disposed to penetrate the opening TA of the substrate T, and the at least one but not all of the detection coils L is a detection coil L corresponding to a position on the coin apart from the center 10$c$ of the coin 10 by a predetermined distance when the center 10$c$ of the coin 10 passes through the opening TA. This enables continuous output of a signal of an area at a certain distance from the center 10$c$ of the coin 10 even, when the coin 10 has an opening (through hole) at the center 10$c$ regardless of the diameter of the coin 10 and the transport position of the coin 10. This enables more stable detection of a magnetic feature of the coin 10.

In the above embodiment, the number of the at least one but not all of the detection coils L is one or two. This can improve the ability to detect a magnetic feature of a bicolor coin 101 or a bicolor clad coin 103.

The magnetism detection device 100 of the above embodiment further comprises the exciting coil LX configured to generate a magnetic field M in the transport path 121, the detection coils L include reflective detection coils L1 arranged on the same side as the exciting coil LX relative to the transport surface 122 and transmissive detection coils L2 arranged on the side opposite to the exciting coil LX relative to the transport surface 122, and the controller 120 is configured to detect a magnetic feature of the coin 10 based on an output signal of the at least one but not all of the reflective detection coils L1 and an output signal of the at least one but not all of the transmissive detection coils L2. This enables detection of a reflection signal on the surface of the coin 10 with the reflective detection coils L1 and detection of a transmission signal of the sum of the surface and inside of the coin 10 with the transmissive detection coils L2. Further, a magnetic feature of the coin 10 is detected based on an output signal (reflection signal) of any part of the reflective detection coils L1 and an output signal (transmission signal) of any part of the transmissive detection coils L2. This enables comparison between the reflection signals and the transmission signals of the detection coils L. As a result, this enables detection of a clad structure of the coin 10 even when a magnetic field M of the exciting coil LX is generated based on a voltage of a single frequency. Further, generation of a magnetic field M of the exciting coil LX based on a voltage of multiple frequencies can easily improve the ability to detect a clad structure of the coin 10. The reflection signals and the transmission signals of the detection coils L enable recognition of the material contained in the clad structure as being either a magnetic material or a nonmagnetic material.

The magnetism detection device 100 of above embodiment further comprises the substrate T on which the detection coils L are arranged, the transport path 121 is disposed to penetrate the opening TA of the substrate T, and the at least one but not all of the reflective detection coils L1 and the at least one but not all of the transmissive detection coils L2 are detection coils L each corresponding to a center portion of the coin 10 when the center 10c of the coin 10 passes through the opening TA. This enables detection of a magnetic feature using a detection coil L having a higher degree of overlapping the coin 10, further improving the ability to detect a material.

The magnetism detection devices 100 and 100A of the above embodiment are each designed to have a variable size in accordance with at least one of the use of the magnetism detection device 100 or 100A or the type of a device on which the magnetism detection device 100 or 100A is to be mounted. Thus, the magnetism detection devices 100 and 100A each can support arty width w of the transport path 121 and can support a variety of uses and the requirements specification of a variety of detector-supporting devices.

In the above embodiment, the transport path 121 is designed to have a variable width w in accordance with at least one of the use of the magnetism detection device 100 or 100A or the type of a device on which the magnetism detection device 100 or 100A is to be mounted. Thus, the magnetism detection devices 100 and 100A each can, support any width w of the transport path 121 and can support a variety of uses and the requirements specification of a variety of detector-supporting devices.

The magnetism detection devices 100 and 100A of the above embodiment each further comprise the housing S that accommodates the detection coils L, and the component U or UA that defines both ends of the transport path 121 in the width direction of the transport path 121. Preparing the components U and UA as components separate from the housing S enables any setting of the positional relationships of the structures relating to transport of a coin 10, such as the position of the one-side alignment surface 123, the width w, length l, and position of the transport path 121, and the position of the gate SC. Thus, the magnetism detection devices 100 and 100A each can support the requirements specification of a variety of detector-carrying devices. These positional relationships of the structures can be set without changing the shape of the substrate T on which the coils are mounted and the position at which the magnetism detection device 100 or 100A is mounted on a detector-carrying device. This can stabilize the detection ability of the magnetism detection device 100 or 100A and the recognition ability (quality) of the coin recognition device 1000 based thereon.

In the above embodiment, the magnetism detection device 100 and 100A each have a left-right asymmetrical shape on one side of the transport surface 122 with the transport surface 122 being horizontally placed and observed along the transport direction 120a (in a front view). This enables mounting of each of the magnetism detection devices 100 and 100A on a detector-carrying device by two fitting methods which are reversed relative to the transport direction 120a for a coin 10. This enables more flexible setting of the positional relationships of the structures relating to transport of a coin 10, such as the position of the one-side alignment surface 123, the width w, length l, and position of the transport path 121, and the position of the gate SC. Thus, the magnetism detection devices 100 and 100A each can support the requirements specification of a variety of detector-carrying devices. These fitting methods can be selected without changing the shape of the substrate T on which the coils are mounted and the position at which the magnetism detection device 100 or 100A is mounted on a detector-carrying device. This can stabilize the detection ability of the magnetism detection devices 100 and 100A and the recognition ability (quality) of the coin recognition device 1000 based thereon.

In the above embodiment, the controller 120 is configured to select the at least one but not all of the detection coils L based on all output signals of the detection coils L. This allows the controller 120 to select a detection coil L particularly suitable for detection of a magnetic feature of a coin, further improving the ability to detect a magnetic feature of a coin.

In the above embodiment, the at least one but not all of the detection coils L is a detection coil L determined before detection of a magnetic feature of the coin 10 in accordance with the type of the coin 10. This can eliminate the need for storing the outputs of all detection coils L in the memory 300, preventing a reduction in the memory capacity of the memory 300. This can also omit the step of collecting the outputs of all detection coils L and selecting the detection coil L for material detection, improving the processing speed.

In the above embodiment, the coin 10 (coin 104) has a through hole 10h, the detection coils L include one or more detection coil groups LA1 and LA2 each including two or more detection coils L arranged at constant pitches, and two or more consecutive detection coils L of each detection coil group LA1 or LA2 are within the region $10h_1$ having the same size as the through hole 10h in a plan view of the transport surface 122. This allows the detector to detect the presence or absence of the through hole 10h.

In the above embodiment, the coin 10 is a bicolor coin 101 including a core 101a at a center portion and a ring 101b at a peripheral portion, the core and the ring being made of different materials, the detection coils L include one or more detection coil groups LA1 and LA2 each including two or more detection coils L arranged at constant pitches, and two or more consecutive detection coils of each detection coil group LA1 or LA2 are within a region having the same width w1 as the width w1 of the ring in a plan view of the transport 122. This allows the detector to detect a signal of the ring 101b alone.

In the above embodiment, each of the detection coils L is preferably a coil chip inductor.

In the above embodiment, the coil chip inductor has a width of 0.3 mm or greater and 3.0 mm or smaller in a direction crossing the transport direction 120a. This enables secure collection of magnetic signals corresponding to fine portions of a coin 10.

The coin recognition device 1000 of the above embodiment includes the magnetism detection device 100 or 100A and the recognizer 210 configured to recognize the coin 10 based on a detection result from the magnetism detection device 100 or 100A. This can improve the ability to recognize a coin 10.

The method for detecting magnetism using a magnetism detection device of the above embodiment is a method of detecting magnetism using the magnetism detection device 100 that includes the controller 120 and the detection coils L arranged on at least one side of the transport surface 122 of the transport path 121 on which the coin 10 is to be transported and along a direction crossing the transport direction 120a of the coin 10, the method comprising detecting a magnetic feature of the coin 10 by the controller 120 based on an output signal of at least one but not all of the detection coils L. This can improve the ability to detect a magnetic feature of a coin 10 and can reduce a change in outputs due to a change in transport positions of coins 10 similar to the case of the magnetism detection device 100 of the above embodiment.

Modified Embodiment

Described in the above embodiment is the case of detecting a magnetic feature of a coin 10 based on an output signal of each detection coil L, in other words, the case in which each detection coil L and each output channel of the magnetism detector 110 are in one-to-one correspondence and the controller 120 detects a magnetic feature of a coin 10 in a single detection coil L. Alternatively, each output channel of the magnetism detector 110 may output a synthesized signal which is synthesis of output signals of multiple detection coils L and the controller 120 may detect a magnetic feature of a coin 10 in multiple detection coils L.

Figure 21:
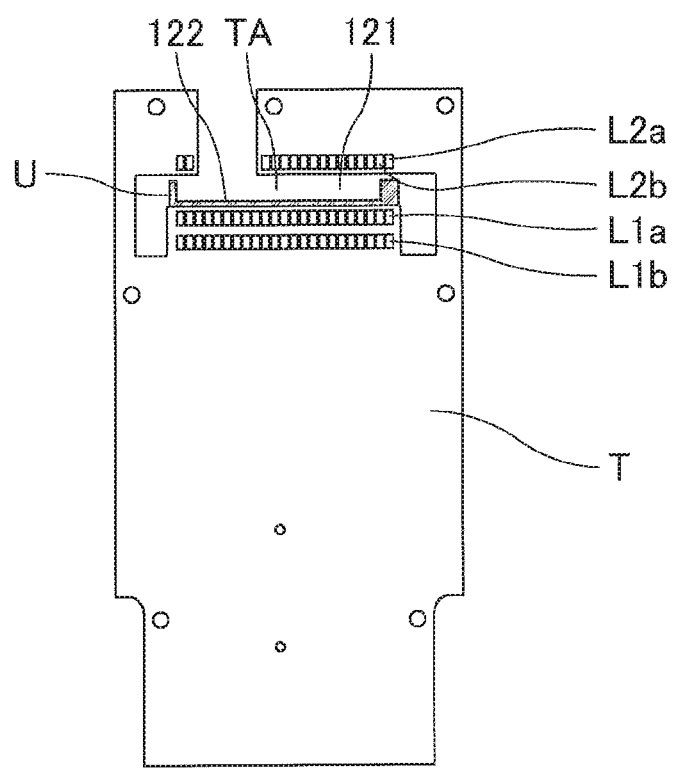
FIG. 21 is a schematic view of a substrate of a magnetism detection device used in a coin recognition device of a modified embodiment of the present invention observed in the transport direction of a coin.

Specifically, as illustrated in FIG. 21, the reflective detection coils L1 may be arranged in two lines parallel to the transport surface 122. Each of output channels for reflective magnetism detection may output a synthesized signal which is synthesis of output signals of two reflective detection coils L1a and L1b vertically adjacent to each other. Each of output channels for transmissive magnetism detection may output a synthesized signal which is synthesis of output signals of two transmissive detection coils L2a and L2b adjacent in the direction perpendicular to the transport direction 120a. Two reflective detection coils L1a and L1b of the same output channel may be configured to output signals of opposite phases. The same applies to the transmissive detection coils L2a and L2b of the same output channel.

Described in the above embodiment is the case where the magnetism detection device 100 has a left-right asymmetrical shape on one side of the transport surface 122 in a front view. The magnetism detection device 100 may have a left-right symmetrical shape on one side of the transport surface 122, preferably on the upper side thereof, in a front view. In the case where a coin 10 is passed through the transport path 121 by rolling by its own weight or by being put onto the transport path 121 with an extrusion mechanism, for example, without a transport element such as a fin or a transport belt, the magnetism detection device 100 may have a shape without any gap (gate SC) for accommodating a transport element. In this case, the magnetism detection device 100 typically has a left-right symmetrical shape on the upper side of the transport surface 122 in a front view.

Described in the above embodiment is the case of mounting the detection coils L only on one surface of the substrate T. Each surface of the substrate T may be provided with a plurality of detection coils L.

Described in the above embodiment is the case of the magnetism detector 110 including a mutual induction-type magnetism sensor. The magnetism detector 110 may be a self-excitation-type magnetic sensor instead of the mutual induction-type magnetism sensor.

The embodiments of the present invention have been described with reference to the drawings. The embodiments, however, are not intended to limit the scope of the present invention. The structures in the respective embodiments may appropriately be combined or modified within the spirit of the present invention.

INDUSTRIAL APPLICABILITY

As described above, the present invention provides a technique useful for detecting the materials of coins.

REFERENCE SIGNS LIST

10, 104: coin
10c: center of coin
10h: through hole
10$h_1$: region
10L: coin having larger diameter
10S: coin having smaller diameter
100, 100A: magnetism detection device
101: bicolor coin
101a, 103a: core
101b, 103b: ring
102: clad coin
102a, 103a1: core material
102b, 103a2: surface layer
103: bicolor clad coin
110: magnetism detector
120: controller
120a: transport direction
121: transport path
122: transport surface
123: one-side alignment surface
123a: one-side alignment surface of magnetism detection device of Embodiment 1
123b: one-side alignment surface of magnetism detection device of Modification 1 of Embodiment 1
124: counter alignment surface
200: recognition controller
210: recognizer
220: transport controller
230: processor
300: memory
400: communicator
500: transporter
1000: coin recognition device
ADC1: reflective A/D converter
ADC2: transmissive A/D converter
AMP1: reflective amplifier
AMP2: transmissive amplifier
COX: exciting core
CO1, CO2: detection core
DC: determination circuit
HPF1: reflective high-pass filter
HPF2: transmissive high-pass filter
LA1, LA2: detection coil group
L, LL, LL1, LL2: detection coil
LPF1: reflective low-pass filter
LPF2: transmissive low-pass filter
LX: exciting coil
L1, L1a, L1b: reflective detection coal L2, L21, L22, L2a, L2b: transmissive detection coil
l: length of transport path
M: magnetic field
RE1: reflective rectifying/smoothing circuit
RE2: transmissive rectifying/smoothing circuit
S: housing
S1: case of housing
S2: cover of housing
SB: fitting reference
SC: gate
Sout: determination signal
S21, S22: detection signal
S31, S32, S41, S42, S51, S52: signal
T: substrate
TA: opening
U, UA: component (spacer)
U1: fixing component
V1: mono-metallic curve
V2, V3, V4: region
W: processor
w: width of transport path
w1: width
Y: sensor
Z: AC power source
Z1: AC voltage

The invention claimed is:

1. A magnetism detection device comprising:
a transport path having a transport surface on which a coin is to be transported in a transport direction;
detection coils arranged on at least one side of the transport surface of the transport path and along a direction crossing the transport direction of the coin; and
a controller configured to detect a magnetic feature of the coin based on an output signal from a subset of the detection coils comprising at least one but not all of the detection coils,
wherein the coin is a bicolor coin including a core at a center portion and a ring at a peripheral portion, the core and the ring being made of different materials,
the detection coils include one or more detection coil groups each including two or more detection coils arranged at constant pitches, and
two or more consecutive detection coils of each detection coil group are within a region having a same width as the ring in a plan view of the transport surface.

2. The magnetism detection device according to claim 1, further comprising a substrate on which the detection coils are arranged, wherein the substrate has an opening,
wherein the transport path is disposed to penetrate the opening of the substrate, and
wherein the subset of the detection coils includes a detection coil arranged to correspond to an inside position on the coin from an edge of the coin by a predetermined distance when the center of the coin passes through the opening.

3. The magnetism detection device according to claim 1, further comprising a substrate on which the detection coils are arranged, wherein the substrate has an opening,
wherein the transport path is disposed to penetrate the opening of the substrate, and
wherein the subset of the detection coils includes a detection coil arranged to correspond to a position on the coin distanced from the center of the coin by a predetermined distance when the center of the coin passes through the opening.

4. The magnetism detection device according to claim 1, wherein the number of the detection coils included in the subset of the detection coils is one or two.

5. The magnetism detection device according to claim 1, further comprising:
a housing that accommodates the detection coils; and
a component that defines both ends of the transport path in a width direction of the transport path.

6. The magnetism detection device according to claim 1, wherein the magnetism detection device has a left-right asymmetrical shape on one side of the transport surface with the transport surface being horizontally placed and observed along the transport direction.

7. The magnetism detection device according to claim 1, wherein the controller is configured to select the subset of the detection coils based on all output signals of the detection coils.

8. The magnetism detection device according to claim 1, wherein the subset of the detection coils includes a detection coil determined before detection of a magnetic feature of the coin in accordance with the type of the coin.

9. The magnetism detection device according to claim 1, wherein each of the detection coils is a coil chip inductor.

10. The magnetism detection device according to claim 9, wherein the coil chip inductor has a width of 0.3 mm or greater and 3.0 mm or smaller in a direction crossing the transport direction.

11. A coin recognition device comprising:
the magnetism detection device according to claim 1; and
a recognizer configured to recognize the coin based on a detection result from the magnetism detection device.

12. A magnetism detection device comprising:
a transport path having a transport surface on which a coin is to be transported in a transport direction;
detection coils arranged on at least one side of the transport surface of the transport path and along a direction crossing the transport direction of the coin;
a controller configured to detect a magnetic feature of the coin based on an output signal from a subset of the detection coils comprising at least one but not all of the detection coils; and
an exciting coil configured to generate a magnetic field in the transport path,
wherein the detection coils include reflective detection coils arranged on a same side as the exciting coil relative to the transport surface and transmissive detection coils arranged on a side opposite to the exciting coil relative to the transport surface, and
the controller is configured to detect a magnetic feature of the coin based on an output signal of a subset of the reflective detection coils including at least one but not all of the reflective detection coils and an output signal of a subset of the transmissive detection coils including at least one but not all of the transmissive detection coils.

13. The magnetism detection device according to claim 12, further comprising a substrate on which the detection coils are arranged, wherein the substrate has an opening,
wherein the transport path is disposed to penetrate the opening of the substrate, and
wherein the subset of the reflective detection coils and the subset of the transmissive detection coils include detection coils each corresponding to a center portion of the coin when the center of the coin passes through the opening.

14. A magnetism detection device comprising:
a transport path having a transport surface on which a coin is to be transported in a transport direction;
detection coils arranged on at least one side of the transport surface of the transport path and along a direction crossing the transport direction of the coin; and
a controller configured to detect a magnetic feature of the coin based on an output signal from a subset of the detection coils comprising at least one but not all of the detection coils,
wherein the coin has a through hole,
the detection coils include one or more detection coil groups each including two or more detection coils arranged at constant pitches, and
two or more consecutive detection coils of each detection coil group are within a region having a same size as the through hole in a plan view of the transport surface.

15. A method for detecting magnetism using a magnetism detection device that includes a controller and detection coils arranged on at least one side of a transport surface of a transport path on which a coin is to be transported and along a direction crossing a transport direction of the coin, the method comprising detecting a magnetic feature of the coin by the controller based on an output signal of a subset of the detection coils comprising at least one but not all of the detection coils, wherein the coin is a bicolor coin including a core at a center portion and a ring at a peripheral portion, the core and the ring being made of different materials, the detection coils include one or more detection coil groups each including two or more detection coils arranged at constant pitches, and two or more consecutive detection coils of each detection coil group are within a region having a same width as the ring in a plan view of the transport surface.

* * * * *